United States Patent
Snider et al.

(10) Patent No.: US 7,227,379 B1
(45) Date of Patent: Jun. 5, 2007

(54) NANOSCALE LATCH-ARRAY PROCESSING ENGINES

(75) Inventors: Gregory S. Snider, Mountain View, CA (US); Philip J. Kuekes, Menlo Park, CA (US); Duncan R. Stewart, Menlo Park, CA (US)

(73) Assignee: Hewlett-Packard Develoment Company, L.P., Houston, TX (US)

( * ) Notice: Subject to any disclaimer, the term of this patent is extended or adjusted under 35 U.S.C. 154(b) by 132 days.

(21) Appl. No.: 11/192,197

(22) Filed: Jul. 27, 2005

(51) Int. Cl.
*H03K 19/173* (2006.01)
*G06F 7/38* (2006.01)

(52) U.S. Cl. .......................... 326/38; 326/40; 326/46; 326/104

(58) Field of Classification Search ............ 326/38–41, 326/46, 101, 104, 114; 977/789
See application file for complete search history.

(56) References Cited

U.S. PATENT DOCUMENTS

2003/0089899 A1* 5/2003 Lieber et al. .................. 257/9

2006/0238223 A1* 10/2006 Kuekes et al. ............... 326/134

* cited by examiner

*Primary Examiner*—Anh Q. Tran

(57) ABSTRACT

One embodiment of the present invention is an array of nanoscale latches interconnected by a nanowire bus to form a latch array. Each nanoscale latch in the nanoscale-latch array serves as a nanoscale register, and is driven by a nanoscale control line. Primitive operations for the latch array can be defined as sequences of one or more inputs to one or more of the nanowire data bus and nanoscale control lines. In various latch-array embodiments of the present invention, information can be transferred from one nanoscale latch to another nanoscale latch in a controlled fashion, and sequences of information-transfer operations can be devised to implement arbitrary Boolean logic operations and operators, including NOT, AND, OR, XOR, NOR, NAND, and other such Boolean logic operators and operations, as well as input and output functions. Nanoscale-latch arrays can be combined and interconnected in an almost limitless number of different ways to construct arbitrarily complex, sequential, parallel, or both parallel and sequential computing engines that represent additional embodiments of the present invention.

29 Claims, 27 Drawing Sheets

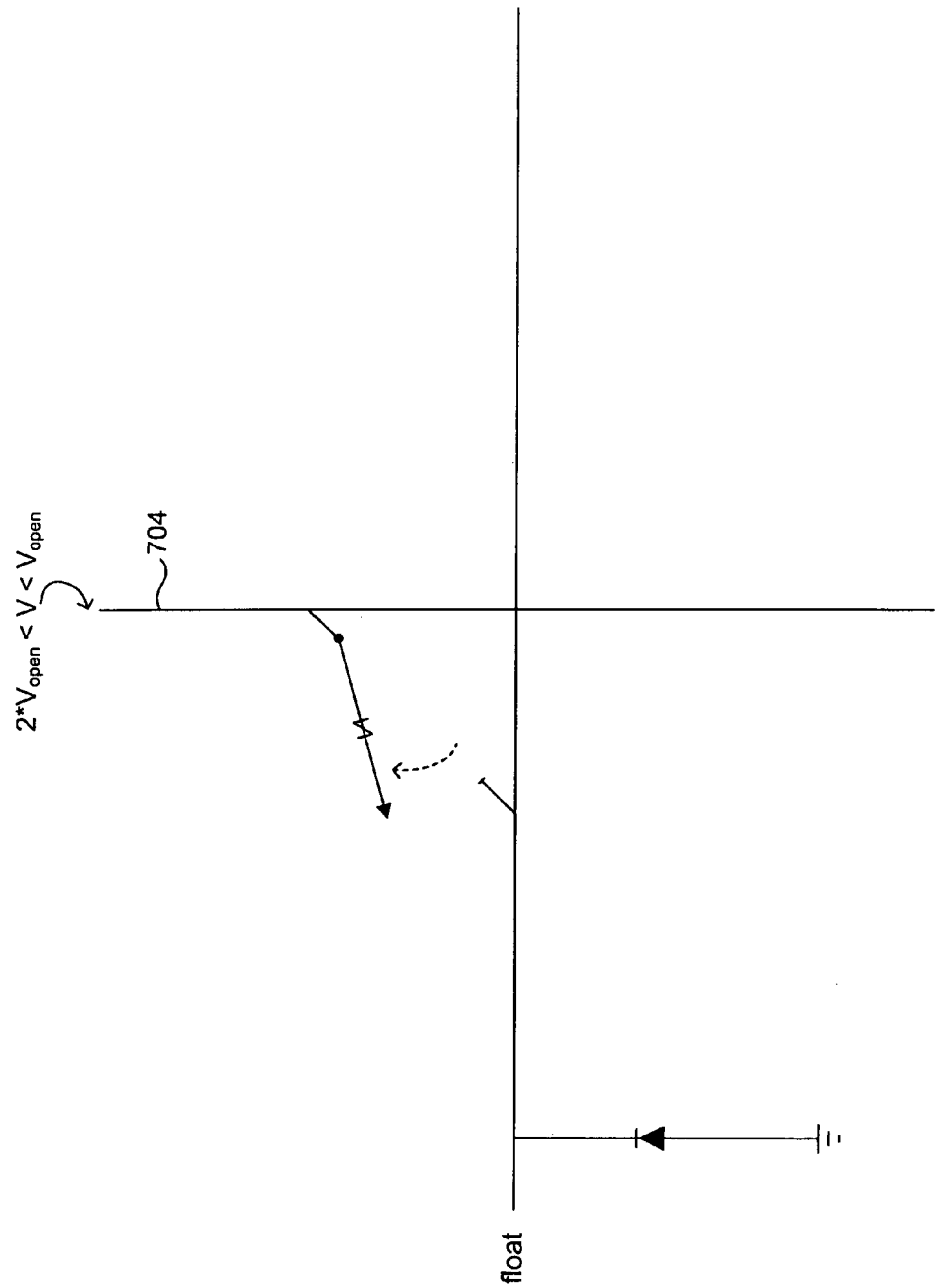

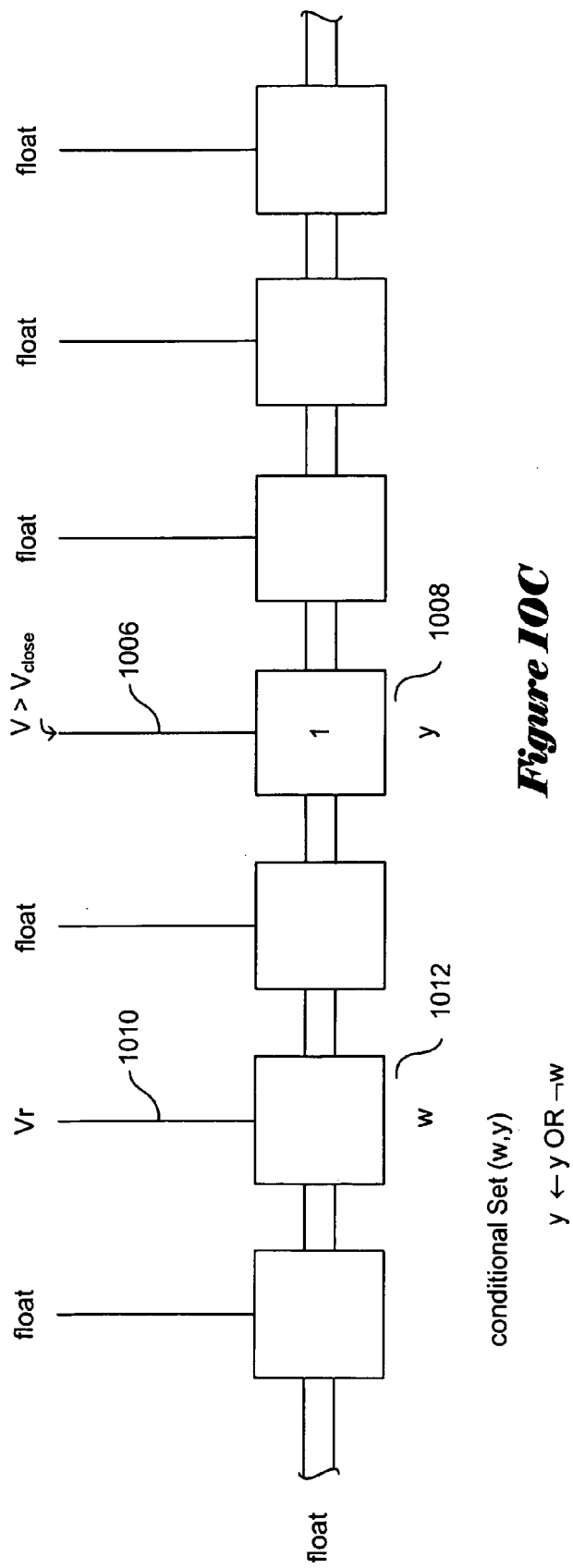

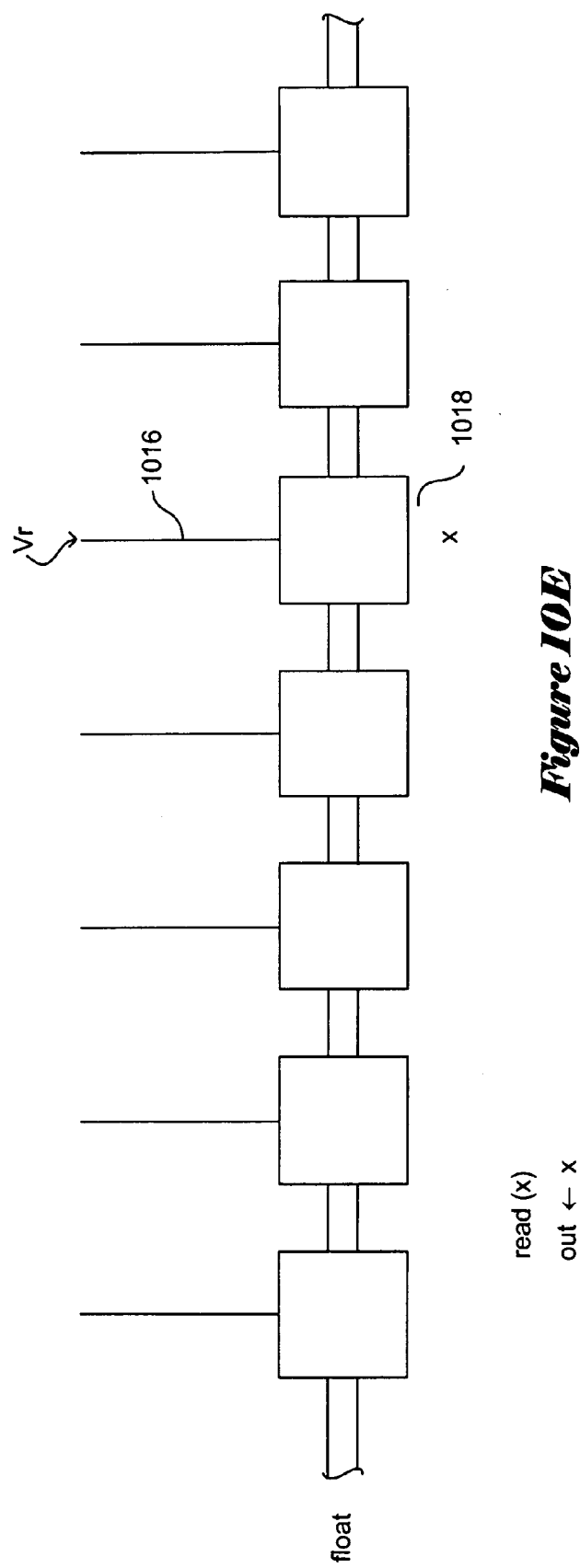

```
// Initialize carry bit to 0.
clear(r6);

// Repeat for each bit position in the two inputs.
loop {
    write(r0);      // read in A bit.
    write(r1);      // read in B bit.

// Start computation of sum.
    r2 = not(r0);
    r3 = not(r1);

// (a ^ b) = (a !b) + (!a b)
    //         = !(!(a !b) !(!a b)
    r4 = nand(r0, r3);     // r4 = !(a !b)
    r5 = nand(r1, r2);     // r5 = !(!a b)
    r2 = nand(r4,r5);      // r2 = a ^ b // let x = (a ^ b)
    // (x ^ c) = (x !c) + (!x c)
    //         = !(!x !c) !(!x c)
    r3 = not(r2);          // bit3 = !(a ^ b)
    r5 = not(r6);          // bit5 = !c r0 = nand(r2, r5);     // bit0 = !(x !c)
    r1 = nand(r3,r6);      // bit1 = !(!x c)
    r2 = nand(r0, r1);     // bit2 = (x ^ c)

// Sum computed, deliver to external environment.
    read(r2);

// Compute new carry, c' = ab + ac + bc.  c is stored, a and b read in.
    //Read in a and b
    write(r0);             // bit0 = a
    write(r1);             // bit1 = b
    r2 = nand(r0, r1);     // bit2 = !(a b)
    r3 = nand(r0, r6);     // bit3 = !(a c)
    r4 = nand(r1, r6);     // bit4 = !(b c)
    r5 = nand(r2,r3);      // bit5 = ab + ac
    r2 = not(r5);          // bit2 = !(ab + ac)
    r6 = nand(r2, r4);     // bit c' = ab + ac + bc
```

*Figure 11*

NANOSCALE LATCH-ARRAY PROCESSING ENGINES

STATEMENT OF GOVERNMENT INTEREST

This invention has been made with Government support under agreement number DARPA #HR0011-05-3-0001. The government has certain rights in the invention.

TECHNICAL FIELD

The present invention is related to molecular electronics and, in particular, to nanoscale processing engines with the full computational power of a Turing machine.

BACKGROUND OF THE INVENTION

During the past 70 years, enormous progress in the theoretical foundations of computer science, in materials science and integrated circuit fabrication, and in systems design and integration have led to fantastic increases in the computational power, flexibility, and affordability of computers, along with a surprising and equally fantastic decrease in the sizes of, and power consumption and dissipation by, modern computer systems. A currently available, inexpensive desktop personal computer provides far more computing power than a supercomputer of twenty years ago. Much of the progress in computing can be attributed to a steady increase in the density of circuitry that can be manufactured in integrated circuits resulting from a steady decrease in the widths of signal lines and dimensions of submicroscale electronic components that can be fabricated by photolithographic processes. Unfortunately, the tiny dimensions at which signal lines and submicroscale electronic components can be manufactured may be approaching physical limits to further size decreases. Further increases in the density of fabricated submicroscale electronic components may depend on using a very different fabrication strategy, rather than photolithography-based methods. Continued progress in computing may depend either on developing new integrated circuit fabrication methods and materials, or may instead depend on finding entirely new strategies for computing, such as quantum computing, massively parallel computer architectures, or other such innovations.

During the past decade, an entirely new fabrication method for nanoscale electronic circuits and nanoscale electronic components has begun to be developed, and has become a foundation of the emerging field of molecular electronics. One promising type of nanoscale-component fabrication process is based on nanoscale crossbars composed of nanowires, with passive and active electronic components, including resistors, diodes, and various types of transistors, fabricated at selected points of overlap between approximately perpendicular nanowires in stacked, orthogonally oriented layers of parallel nanowires. Working nanowire-crossbar circuits have been fabricated in research laboratories, and have been integrated with conventional submicroscale circuitry to produce tiny, high-density memories and logic circuits. Although nanowire crossbars represent an exciting and promising approach to fabrication of computer components at molecular dimensions, much additional research and development effort is needed for commercial production and integration of nanowire-crossbar-based computer components. Many issues remain concerning the reliability of fabrication of passive and active electronic components at nanowire junctions, and much effort will be needed to efficiently construct dense circuitry at molecular dimensions. Furthermore, it remains a challenge to fabricate fully functional processors using nanowire crossbars, because it is not currently easy to store computed values in nanowire crossbars and to route stored, computed values from one storage location to another within nanowire crossbars. For these reasons, researchers, developers, and manufacturers of submicroscale electronics have recognized the need for simple, universal computing devices, with the full computational power of Turing machines (simple theoretical computing devices used in theoretical studies of computability and undecidability that can solve the class of problems solvable by all currently known computing devices), that can be practically fabricated at molecular dimensions and that can be practically controlled and operated to perform general computation tasks.

SUMMARY OF THE INVENTION

One embodiment of the present invention is an array of nanoscale latches interconnected by a nanowire bus to form a latch array. Each nanoscale latch in the nanoscale-latch array serves as a nanoscale register, and is driven by a nanoscale control line. Primitive operations for the latch array can be defined as sequences of one or more inputs to one or more of the nanowire data bus and nanoscale control lines. In various latch-array embodiments of the present invention, information can be transferred from one nanoscale latch to another nanoscale latch in a controlled fashion, and sequences of information-transfer operations can be devised to implement arbitrary Boolean logic operations and operators, including NOT, AND, OR, XOR, NOR, NAND, and other such Boolean logic operators and operations, as well as input and output functions. Nanoscale-latch arrays can be combined and interconnected in an almost limitless number of different ways to construct arbitrarily complex, sequential, parallel, or both parallel and sequential computing engines that represent additional embodiments of the present invention.

BRIEF DESCRIPTION OF THE DRAWINGS

FIGS. 7A–C illustrate operation of a non-inverting nanoscale latch employed in various embodiments of the present invention.

FIGS. 10A–F illustrate five primitive operations and a Boolean operation, implemented as a sequence of primitive operations, for a single-bit nanoscale register array, such as the single-bit nanoscale register array shown in FIG. 9B, that represents one embodiment of the present invention.

FIG. 11 illustrates an implementation of the program "bit serial adder" for execution on a nanoscale-processing-engine embodiment of the present invention.

DETAILED DESCRIPTION OF THE INVENTION

The present invention is related to tiny, nanoscale processing engines with the computational power of Turing machines. In one embodiment, a nanoscale processor is fabricated as an array of nanoscale latches interconnected with one another by a single-bit, nanowire bus, and controlled by a controller and a stored program. The nanoscale latches can be pairwise controlled to implement arbitrary Boolean operations and operators, providing a universal computing machine. In the following discussion, nanoscale latches are first described, followed by a description of nanoscale latch arrays, and finally, a detailed description of the implementation of Boolean operators and operations using primitive operations implemented as sequential application of control signals to nanoscale latches of a nanoscale latch array. An overall architecture for a nanoscale processor is then provided, along with an exemplary program that can be executed by one embodiment of the nanoscale processor of the present invention to add two, arbitrarily long binary numbers.

Figure 1A:
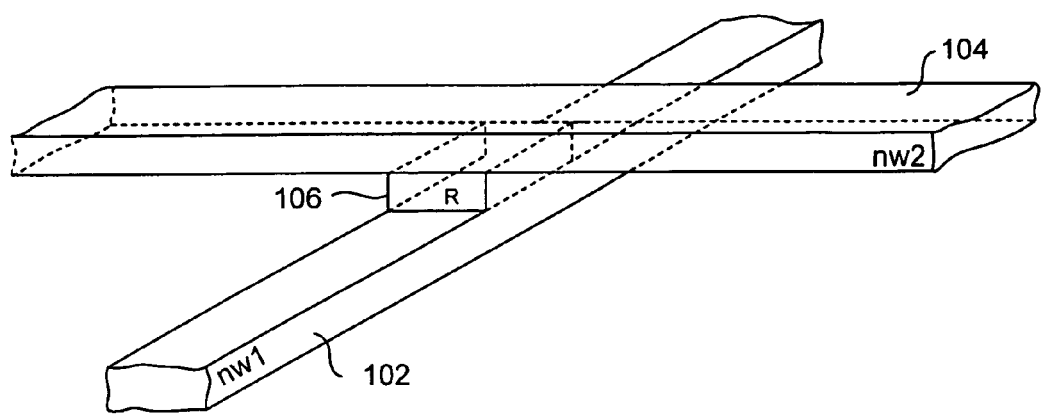
FIGS. 1A–C provide different illustrations of a resistive nanowire junction.
Figure 1B:
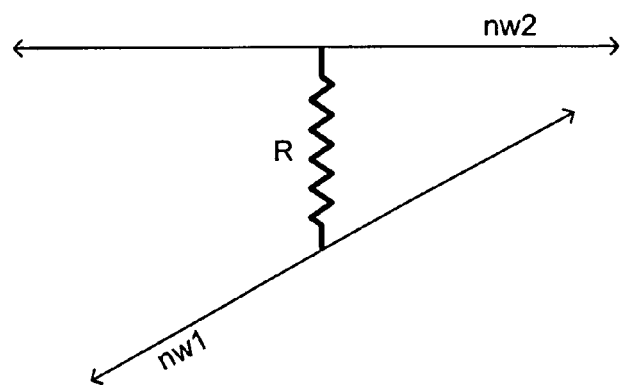
Figure 1C:
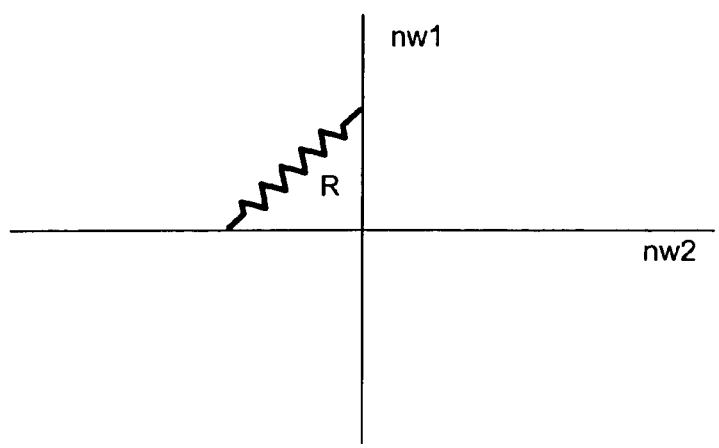

FIGS. 1A–C provide different illustrations of a resistive nanowire junction. In FIG. 1A, a physical representation of the resistive nanowire junction is provided to represent a picture of a resistive, nanowire junction that might be obtained were optical microscopes of sufficient power available to image nanowire junctions. As shown in FIG. 1A, a first nanowire 102 underlies a second nanowire 104, with the two nanowires 102 and 104 approximately perpendicular to one another. A resistive element 106 lies between the two nanowires, in the region of overlap between the two nanowires. Nanowires may be composed of a few, parallel strands of a conducting polymer, a carbon nanotube, a polymer-like chain of metal or semiconductor atoms or molecules, or other conducting or semiconducting materials that can be fabricated at molecular dimensions. The shapes and cross-sectional geometries of nanowires are determined by the molecules that compose them, but generally are complex at molecular dimensions, rather than the simple rectangular shapes shown in FIG. 1A. The resistive element 106 that lies between the two nanowires at their point of closest contact may be composed of one or a small number of molecules that behave as an electrical resistor. A voltage can be applied across a nanowire junction so that an amount of current flows through the junction that is proportional to the applied voltage and inversely proportional to the resistance of the resistive element 106, according to Ohm's Law. FIG. 1B shows a more schematic illustration of the resistive nanowire junction shown in FIG. 1A. FIG. 1C shows a fully schematic illustration of the resistive nanowire junction shown in FIG. 1A. The schematic convention shown in FIG. 1C is employed throughout the remaining figures to represent resistive nanowire junctions.

One particularly important type of resistive junction that can be fabricated by currently available techniques is a hysteretic, resistive nanowire junction. The resistance of a hysteretic, resistive nanowire junction can be controlled, by application of state-transition voltages to the hysteretic, resistive nanowire junction, the resistance alternating between two, bistable resistivity states. In one resistivity state, the nanowire junction has a relatively low resistance, or impedance, and in the other resistivity state, the nanowire junction has a relatively high resistance or impedance. In the current discussion, the time-dependent behavior of nanowire junctions resulting from internal capacitances and other properties is ignored, and the terms "resistance" and "impedance" are therefore interchangeable.

Figure 2:
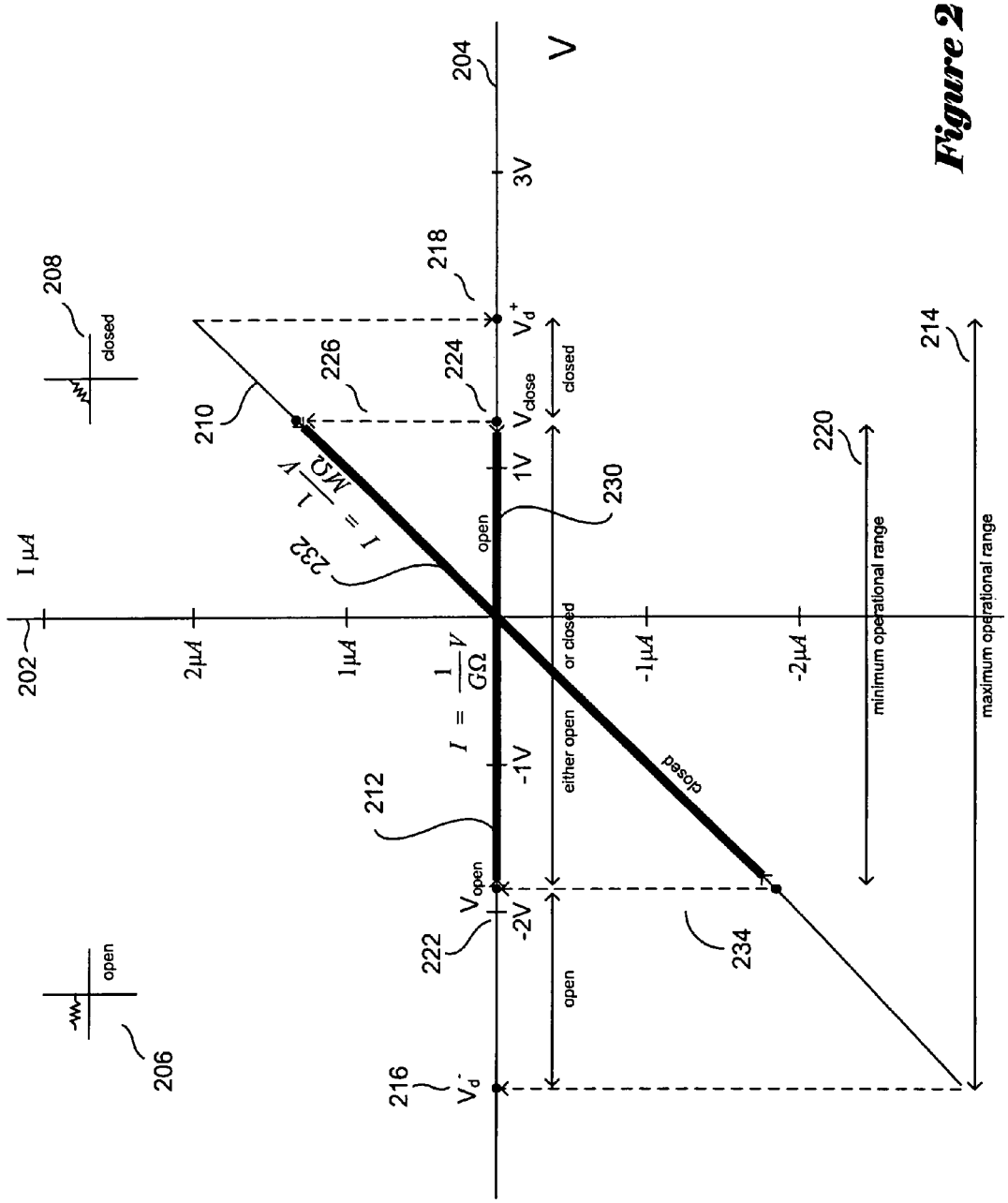
FIG. 2 shows the bistable resistivity states of a hysteretic, resistive nanowire junction and resistivity-state transitions under operational control voltages.

FIG. 2 shows the bistable resistivity states of a hysteretic, resistive nanowire junction and resistivity-state transitions under operational control voltages. FIG. 2 shows plotted current/voltage relationships with respect to a vertical current axis 202 and a horizontal voltage axis 204. The vertical current axis is incremented in microamperes (µA), and the voltage axis 204 is incremented in volts (V). The high resistivity state of the hysteretic, resistive nanowire junction is referred to as the "open" state, schematically represented by the open-switch-like representation of the nanowire junction 206 above a portion of the negative voltage axis. The low resistivity state of the hysteretic, resistive nanowire junction is referred to as the "closed" state, represented by the closed-switch-like schematic 208 shown in FIG. 2 above the positive portion of the voltage axis. FIG. 2 shows the operational characteristics of an actual hysteretic, resistive nanowire junction prepared in the laboratory. The current/voltage relationship for the closed state is plotted as straight line segment 210, and the current/voltage relationship of the open state is plotted as straight line segment 212, imperceptivity positively slanted with respect to the horizontal axis. The closed-state current/voltage relationship can be expressed as:

$$I = \frac{1}{M\Omega} V$$

and the open-state current/voltage relationship can be expressed as:

$$I = \frac{1}{G\Omega} V$$

The maximum operational voltage range 214 for the hysteretic, resistive nanowire junction ranges from just above a negative destructive voltage $V_d^-$ 216 and just below a positive destructive voltage $V_d^+$ 218. When the hysteretic, resistive nanowire junction is in the open, high-resistivity state, the voltage can range over a minimum operational voltage range 220 without the hysteretic, resistive nanowire junction undergoing a resistivity-state transition to the closed state. The minimum operational range ranges from the negative voltage $V_{open}$ 222 to the positive voltage $V_{close}$ 224. As the applied voltage increases to $V_{close}$ 224, the hysteretic, resistive nanowire junction abruptly transitions 226 to the closed state, represented in FIG. 2 by the dashed arrow 226 interconnecting the end points of the two voltage segments 230 and 232 representing the operational voltage-range segments of the open and closed current/voltage relationships, respectively. The voltage can be increased above $V_{close}$ up to just below the destructive positive voltage $V_d^+$, after which point further voltage increase would irreversibly destroy the hysteretic, resistive nanowire junction. As the voltage is decreased, while the hysteretic, resistive nanowire junction is in the closed state, the corresponding current flow decreases to zero and then begins to increase in the opposite direction. As the applied negative voltage approaches $V_{open}$ in magnitude, the hysteretic, resistive nanowire junction abruptly transitions from the closed state to the open state, as represented by the dashed, vertical arrow 234 in FIG. 2. The voltage can be further decreased, with the hysteretic, resistive nanowire junction remaining in the open state, until the negative voltage $V_d^-$ is reached, after which point a further decrease in voltage irreversibly destroys the hysteretic, resistive nanowire junction.

The hysteretic, resistive nanowire junction therefore occupies the open state, or high resistivity state, between voltages $V_d^-$ and $V_{open}$, at the extreme negative voltage portion of the maximum operational voltage range, occupies the closed state, or low resistivity state, in the extreme positive voltage portion of the maximum operational voltage range, between voltages $V_{close}$ and $V_d^+$, and can occupy either of the open or closed states throughout the minimum operational voltage range 220, depending on the last state transition that occurred, either the closed-state-to-open-state transition 234 or the open-state-to-closed-state transition 226.

Figure 3A:
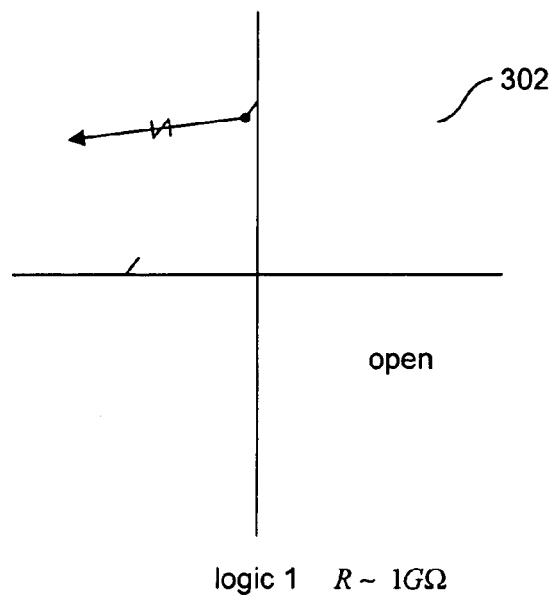
FIGS. 3A–B schematically illustrate storage of a single bit of data within a hysteretic, resistive nanoscale junction.
Figure 3B:
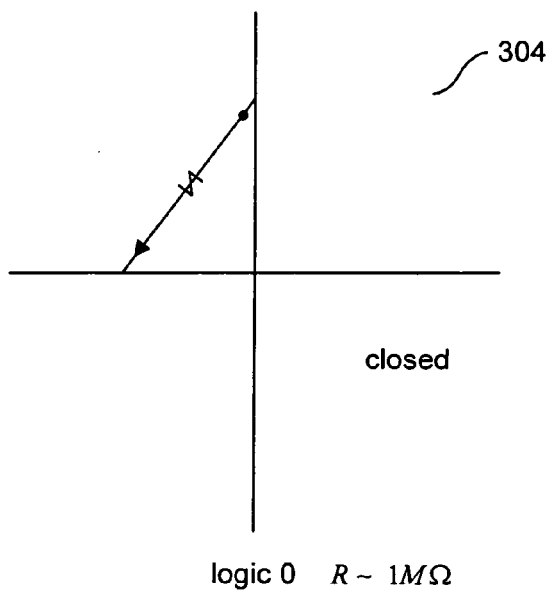

FIGS. 3A–B schematically illustrate storage of a single bit of data within a hysteretic, resistive nanoscale junction. The open state 302, represented as an open switch, corresponds to the high-resistivity state of the hysteretic, resistive nanowire junction, and may be assigned either logical value "1" or logical value "0." For the initial portion of this discussion, the open state is arbitrarily assigned the logical value "1." The open state, in one embodiment prepared in the laboratory, has a resistance of 1 GΩ. The closed state 304 has, in the prepared embodiment, a resistance of 1 MΩ, and is assigned a logical value "0."

Figure 4:
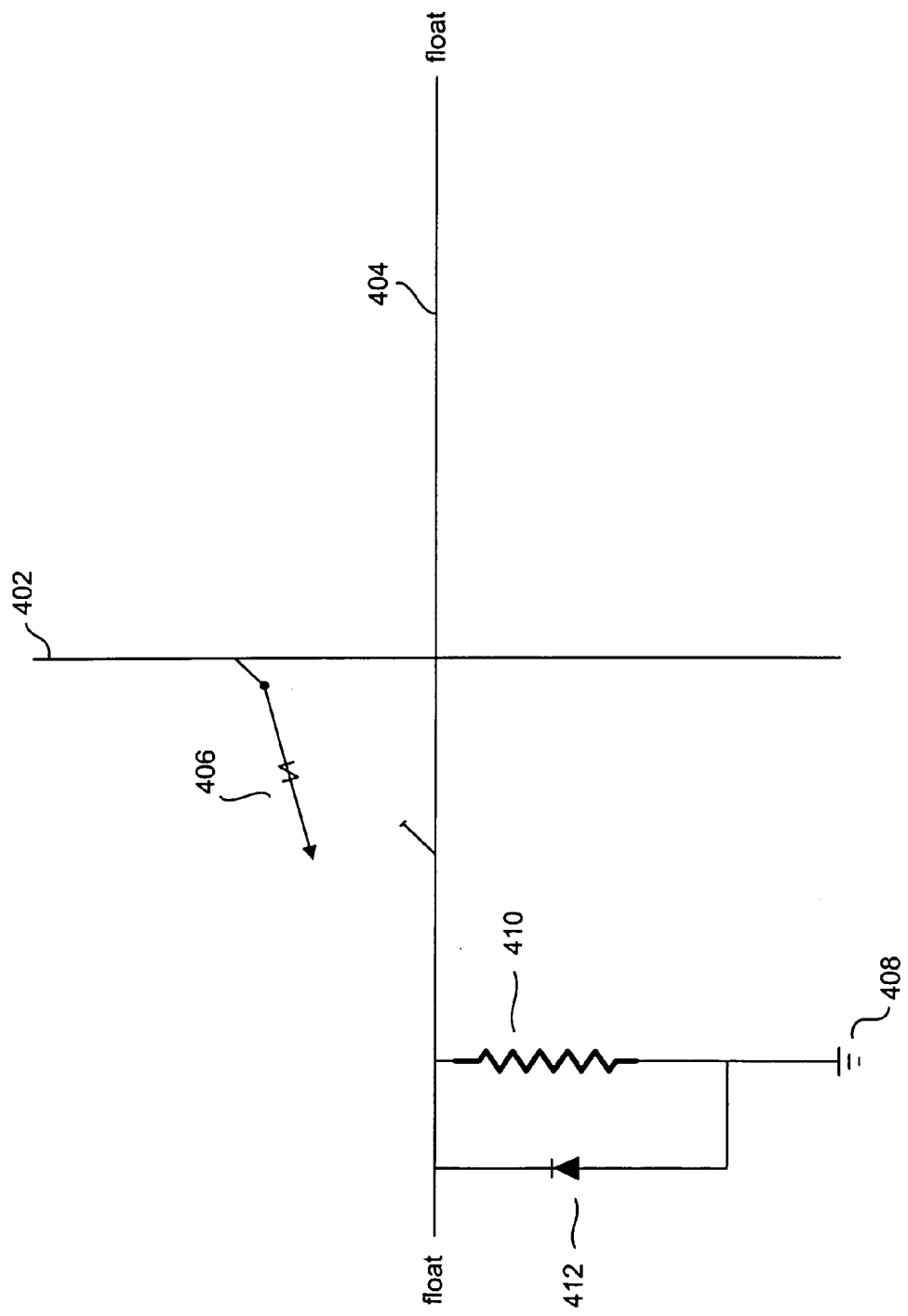
FIG. 4 shows a first embodiment of a nanoscale latch.

A hysteretic, resistive nanowire junction, along with additional components, can be employed as a nanoscale latch, or a one-bit register. FIG. 4 shows a first embodiment of a nanoscale latch. The nanoscale latch includes a control line 402 and a single-bit data bus 404. At the overlap between the vertical control line 402 and the single-bit nanowire bus 404 is a hysteretic, resistive nanowire junction 406. The single-bit, nanowire data bus, referred to subsequently in the discussion as the data bus, is additionally connected to ground 408 via a parallel resistor 410 and diode 412.

Figure 5A:
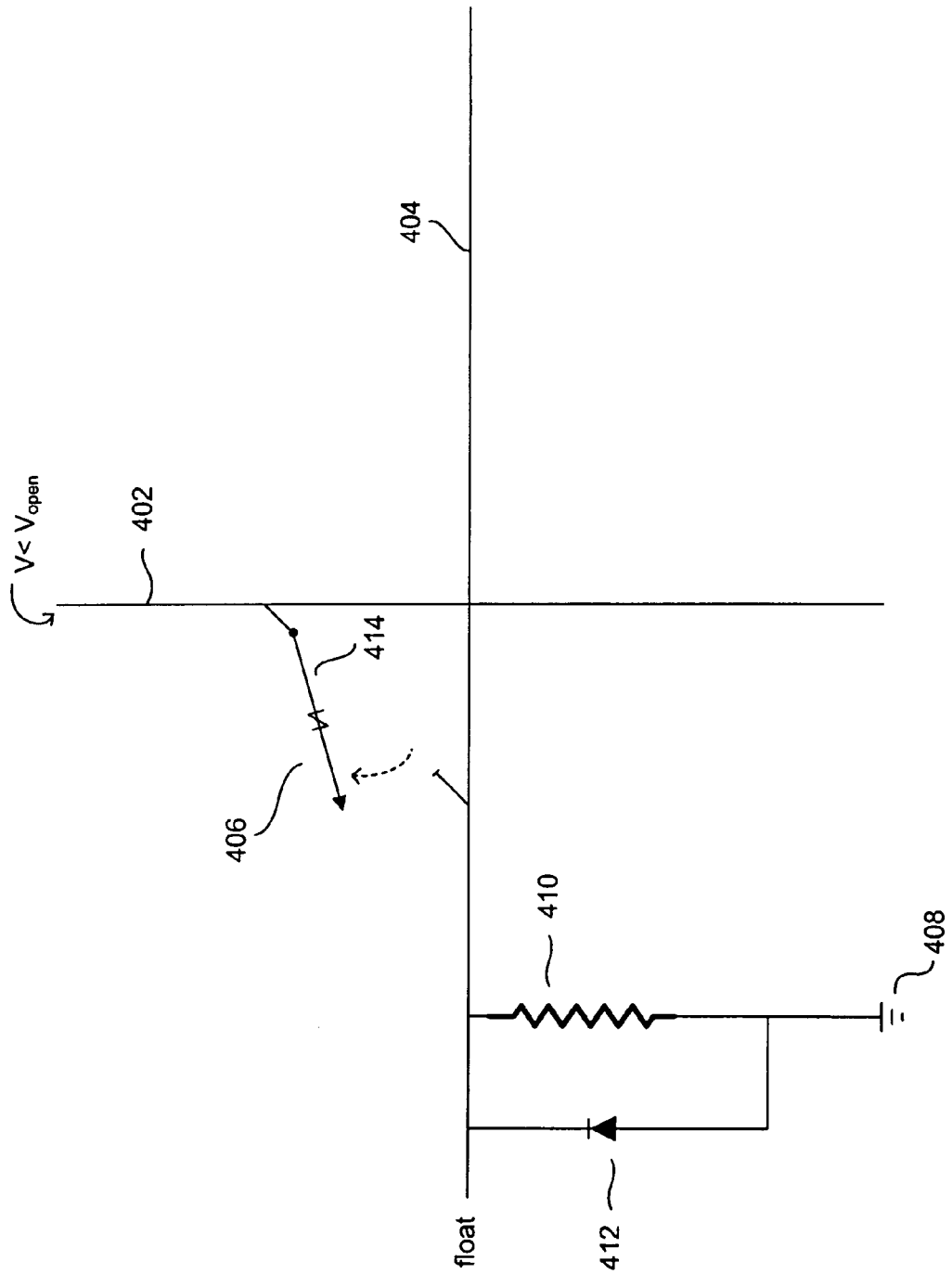
FIGS. 5A–E illustrate operation of the first embodiment of the nanoscale latch shown in FIG. 4.

FIGS. 5A–E illustrate operation of the first embodiment of a nanoscale latch shown in FIG. 4. In order to store a logical value in the nanoscale latch, the nanoscale latch is first opened, as shown in FIG. 5A, by applying a negative voltage less than $V_{open}$ to the control line 402 while the data bus 404 is connected to ground through a very high resistance connection, or uncoupled with other components or signal lines, referred to as a "floating" state. When the nanoscale latch is in the closed state, application of the negative voltage forces the state transition (234 in FIG. 2) to the open state 406. When the nanoscale latch is in the open state, it remains in the open state. It is during the open step illustrated in FIG. 5A that the diode 412 is needed. Were the diode not present, the resistor 410 and the resistive nanowire junction 414 would together form a voltage divider, and in order to drop $V_{open}$ across the nanowire junction 414, in the case that the resistance of the junction and the resistor 410 are equal, a negative voltage of $2 \times V_{open}$ would need to be applied to the control line 402. However, as soon as the nanoscale latch began to open, the entire $2 \times V_{open}$ negative voltage would end up being dropped across the resistive nanowire junction. In general, this large-magnitude negative voltage would exceed $V_d^-$, the negative destruction voltage, and would destroy the resistive nanowire junction. Therefore, the diode 412 in parallel with the resistor 410 ensures that, when a negative voltage is applied to the control line 402, the entire voltage drop occurs across the hysteretic, resistive nanowire junction. The diode 412 allows current flow only when current is flowing from ground 408 to the negative voltage driver driving the control line 402.

Once opened, the nanoscale latch is ready to receive a bit of information. When the data bus 404 is interconnected with ground 418, representing logical value 0, and when a write voltage $V_{write}$ greater than the voltage $V_{close}$ is applied to the vertical control line 402, then a sufficient, positive voltage drops across the hysteretic, resistive junction to cause the state transition (226 in FIG. 2) from the open state to the close state. As discussed with respect to FIG. 3B, the closed state presents logic 0. Thus, when a logic "1" value is input to the data bus 404, a logical value "0" is stored in the nanoscale latch. The nanoscale latch is thus an inverting latch, storing a value opposite from the value input to the data bus. Conversely, as shown in FIG. 5C, when a logical value "0," represented by a voltage $V_{in}$ greater than the difference between $V_{write}$ and $V_{close}$, is supplied to the data bus 404, the voltage drop across the hysteretic, resistive nanowire junction 420 is less than $V_{close}$, and the nanoscale latch remains open. In other words, a logic "0" value input to the data bus results in storage of a logic "1" value in the inverting, nanoscale latch.

Figure 5B:
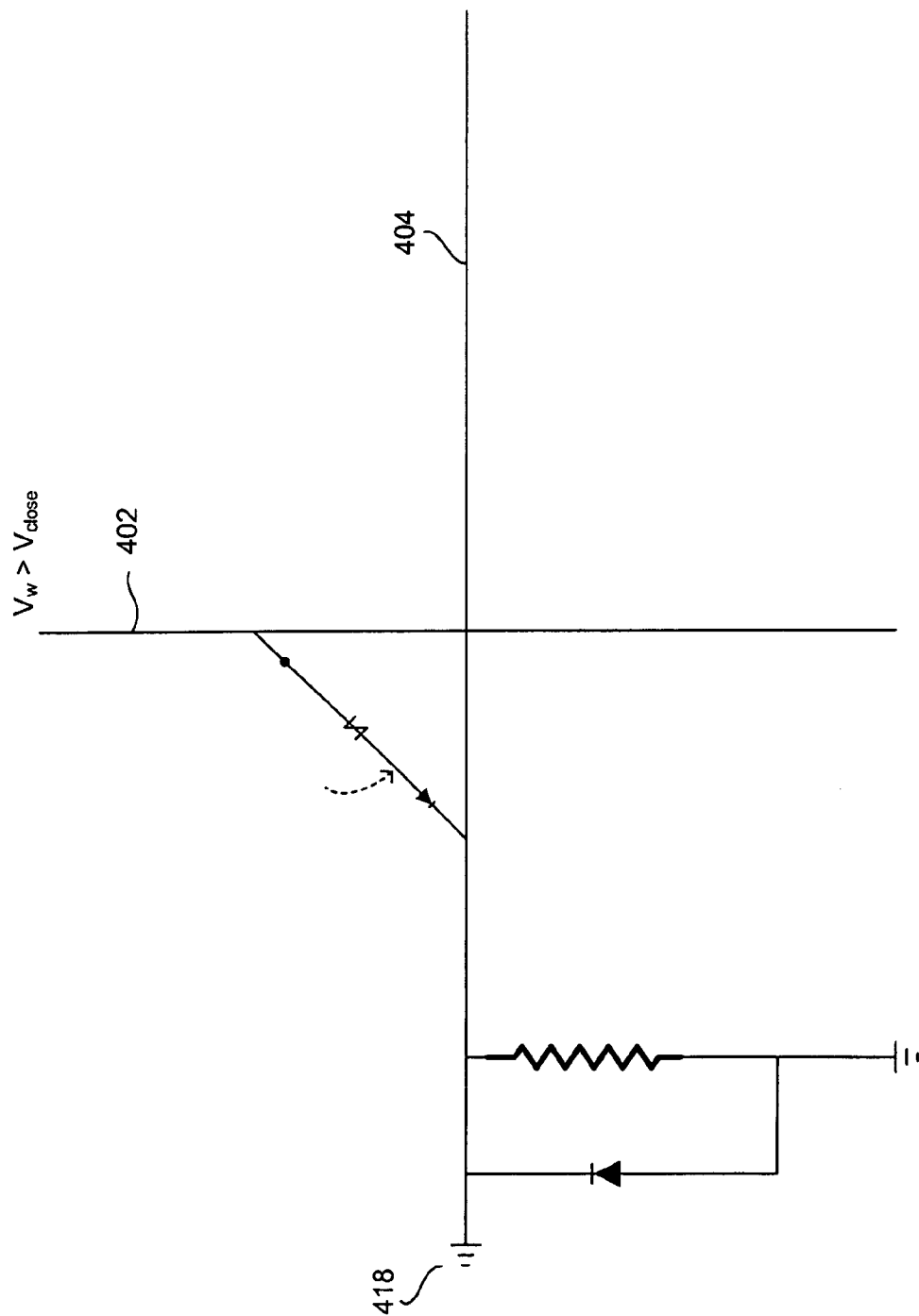
Figure 5C:
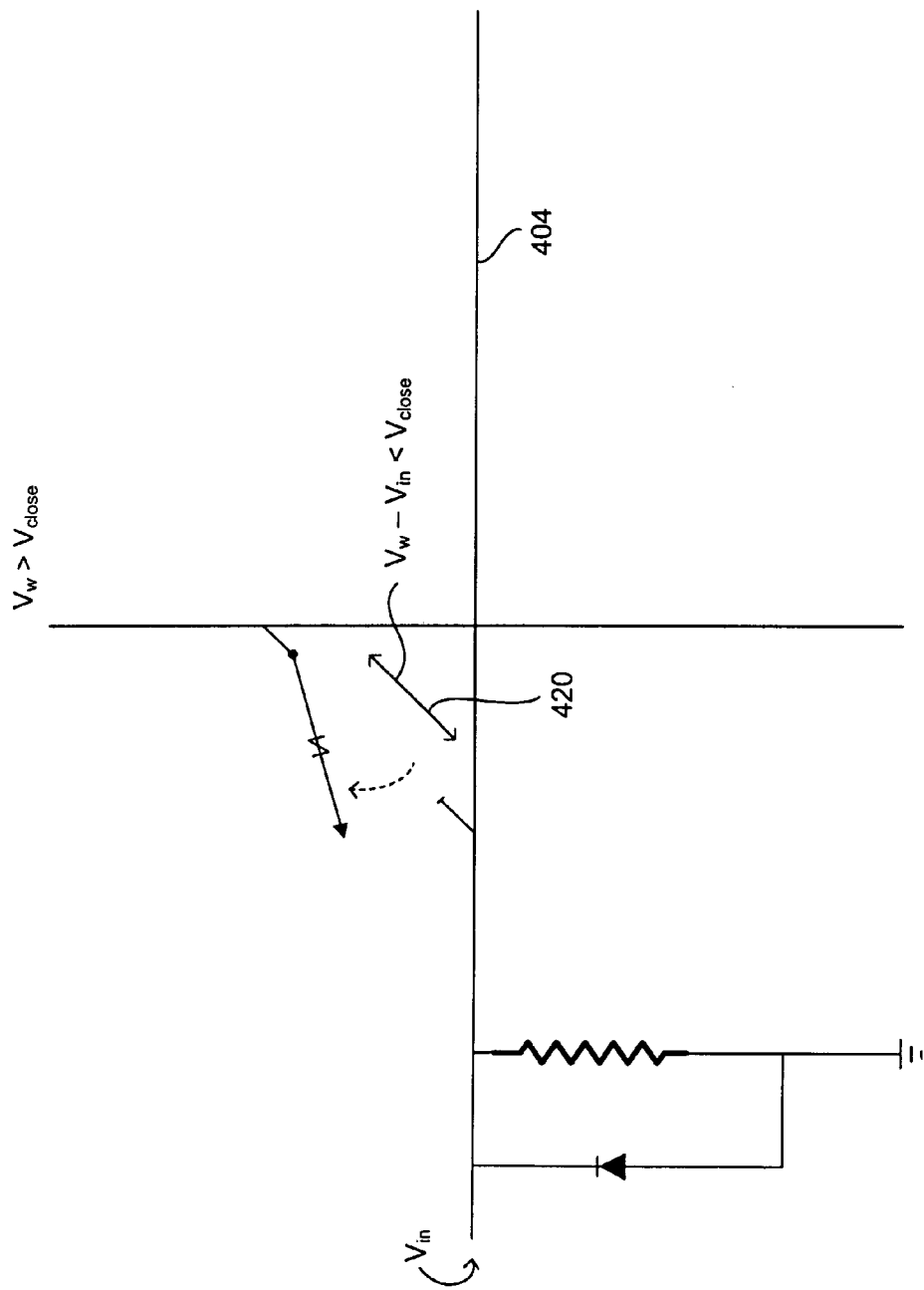
Figure 5D:
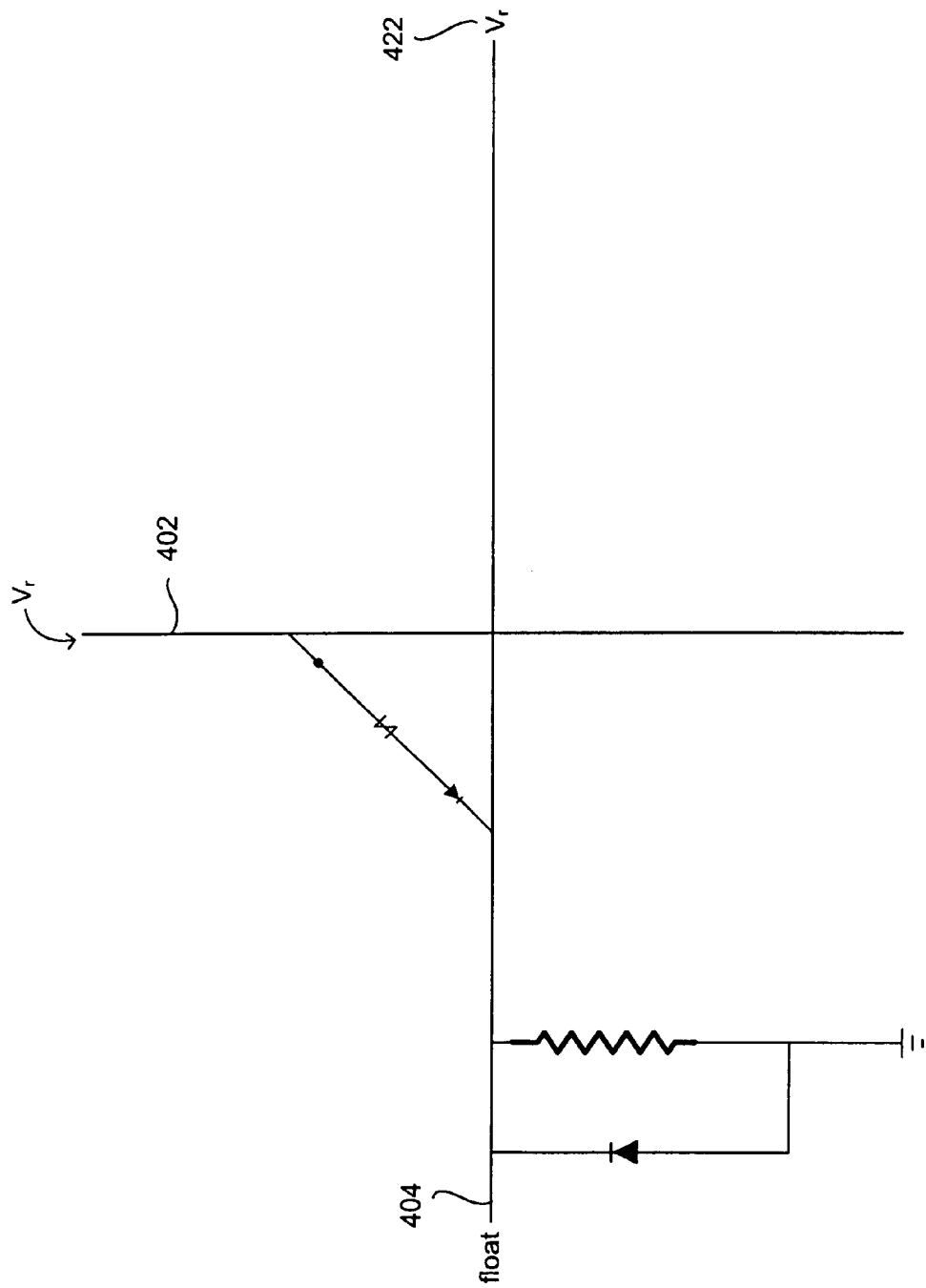
Figure 5E:
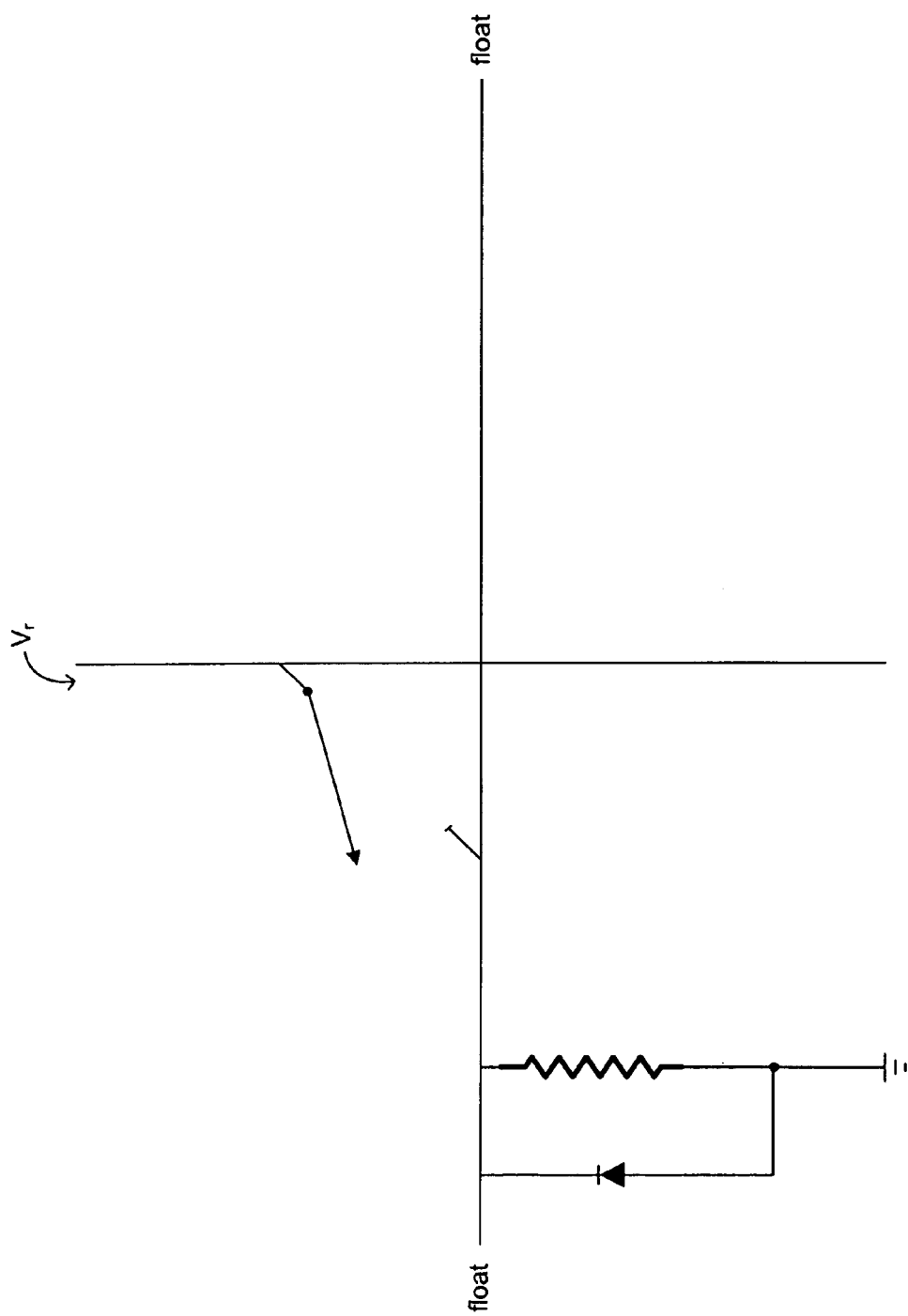

The nanoscale latch is read, as illustrated in FIGS. 5D–E. A read voltage $V_{read}$ is input to the vertical control line 402, while the data bus is placed in the floating state 404. When the nanoscale latch is closed, or in the low resistance state, then a logical value 0, represented by a positive voltage somewhat less than the read voltage $V_{read}$ is output 422. On the other hand, as shown in FIG. 5E, if the nanoscale latch is open, then the output value of the data bus is the floating state, representing the logical value "0." Thus, the contents of the nanoscale latch can be accessed as a voltage state on the data bus, in response to application of a read voltage $V_{read}$ in the vertical control line.

Figure 6A:
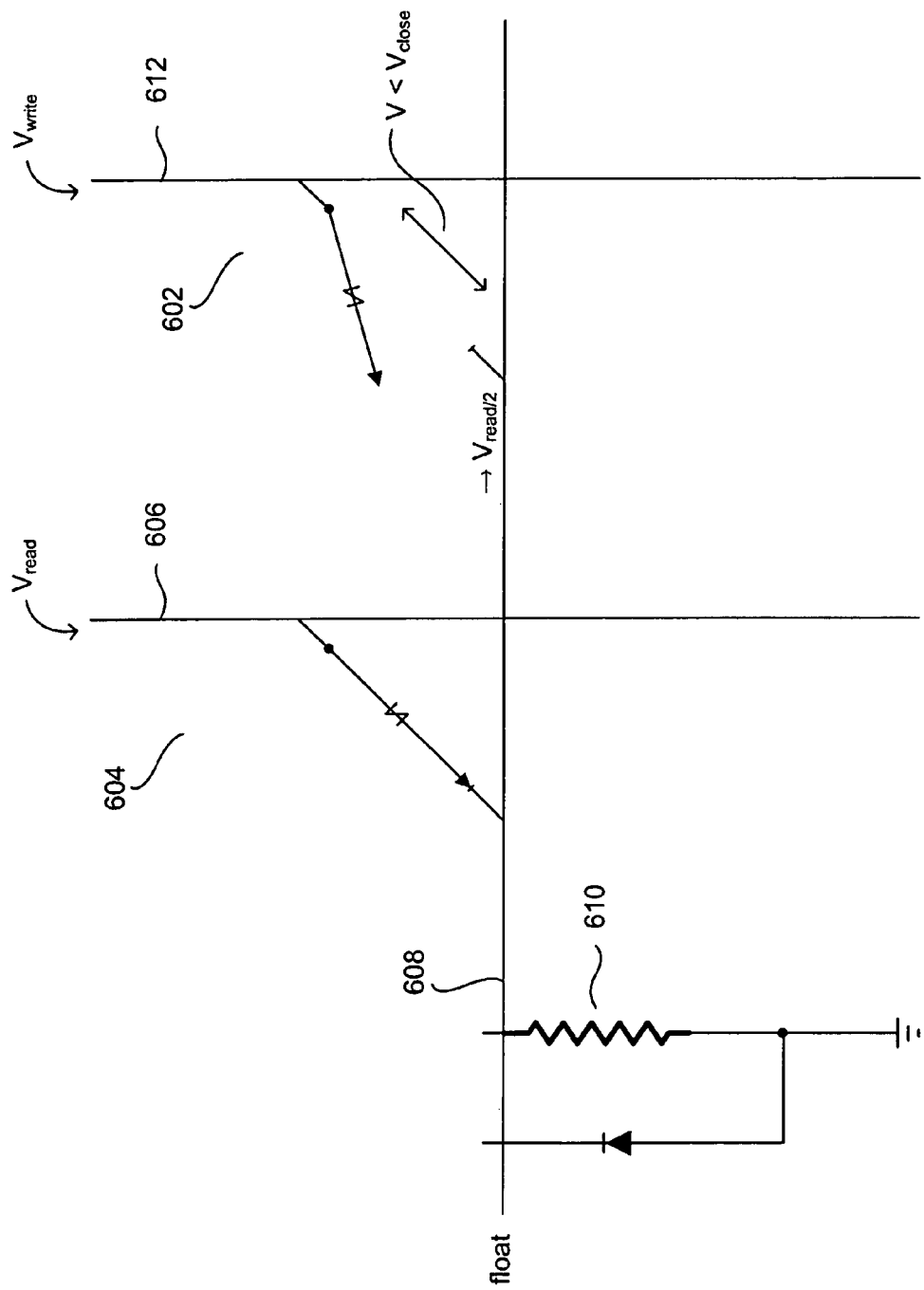
FIGS. 6A–B illustrate transfer of a data value from a first nanoscale latch to a second nanoscale latch on a nanowire data bus, employed in various embodiments of the present invention.
Figure 6B:
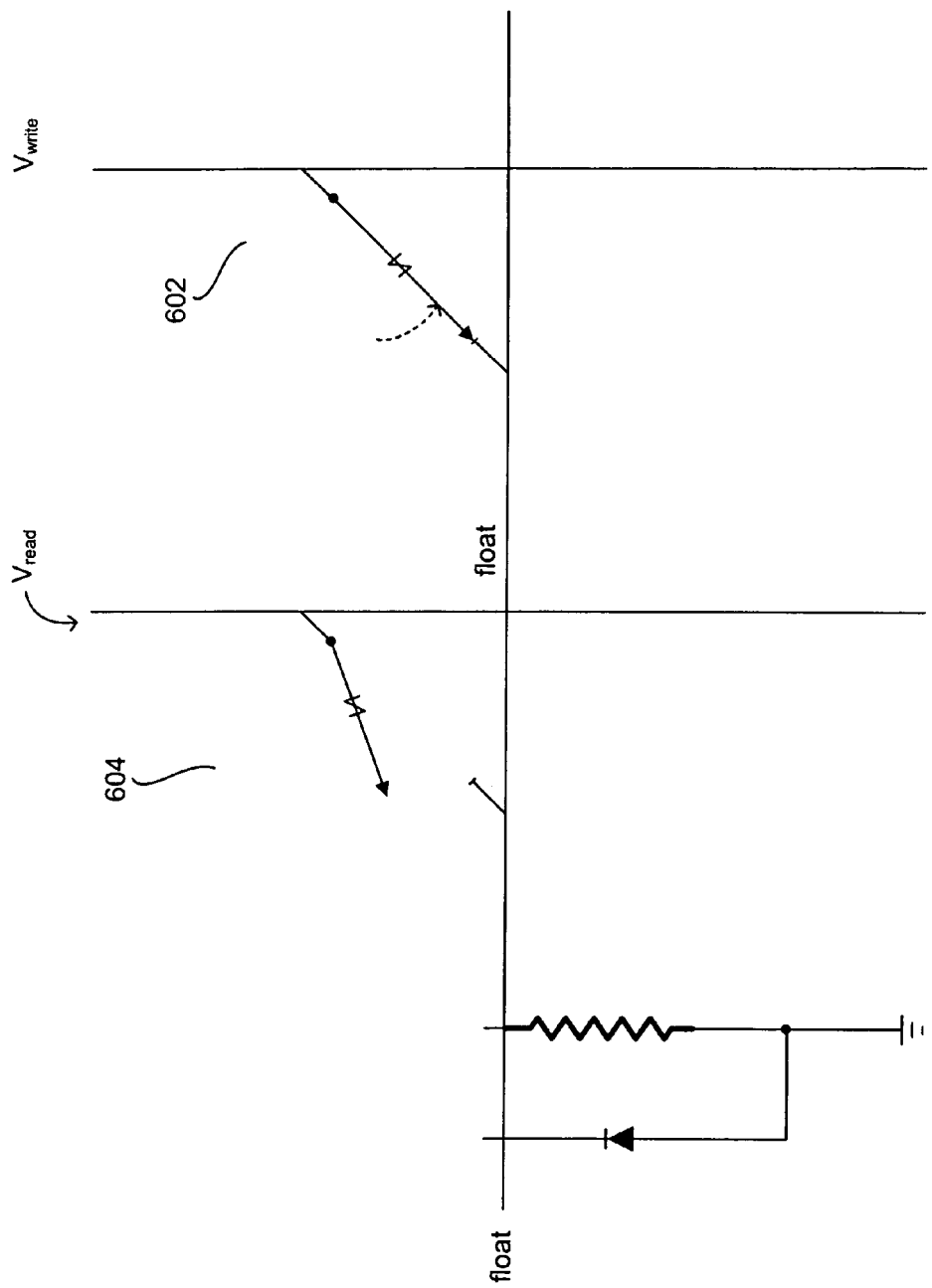

FIGS. 5A–C illustrate storing a data bit in a nanoscale latch by inputting the data bit from an external source via the data bus. A data value can also be transferred from a first nanoscale latch on the data bus to a second nanoscale latch on the data bus. FIGS. 6A–B illustrate transfer of a data value from a first nanoscale latch to a second nanoscale latch on a nanowire data bus, employed in various embodiments of the present invention. In FIG. 6A, the second, or target nanoscale latch 602 is in an open position in preparation for receiving a data value, the nanoscale latch having been opened by the method discussed above with respect to FIG. 5A. The source, or first nanoscale latch 604 is closed, and a read voltage $V_{read}$ is applied to the control line 606 of the source nanoscale latch. The data bus is allowed to float 608. Because the source nanoscale latch is closed, representing a logical value "0," the voltage $V_{read}/2$ is output to the data bus 608, in the case that resistor 610 has approximately the same resistance value as the hysteretic, resistive nanowire junction 604. A positive voltage $V_{write}$ is applied to the vertical control line 612 of the target nanoscale latch 602, in order to store the value on the data bus, $V_{read}/2$, into the nanoscale latch. Because the total voltage drop across the target hysteretic, resistive nanowire junction, $V_{write} - V_{read}/2$, 602 is less than $V_{close}$, the target nanoscale latch remains in the open position, representing the logical value "1." Thus, the inverting target nanoscale latch stores the opposite value from the logical value stored in the source nanoscale latch 604. As shown in FIG. 6B, when the source nanoscale latch is open, representing the logical value "1," then the voltage drop across the target nanoscale latch 602 is greater than $V_{close}$, and the target nanoscale latch transitions to the close state (226 in FIG. 2), storing the opposite logical value from the logical value stored in the source nanoscale latch.

Figure 7A:
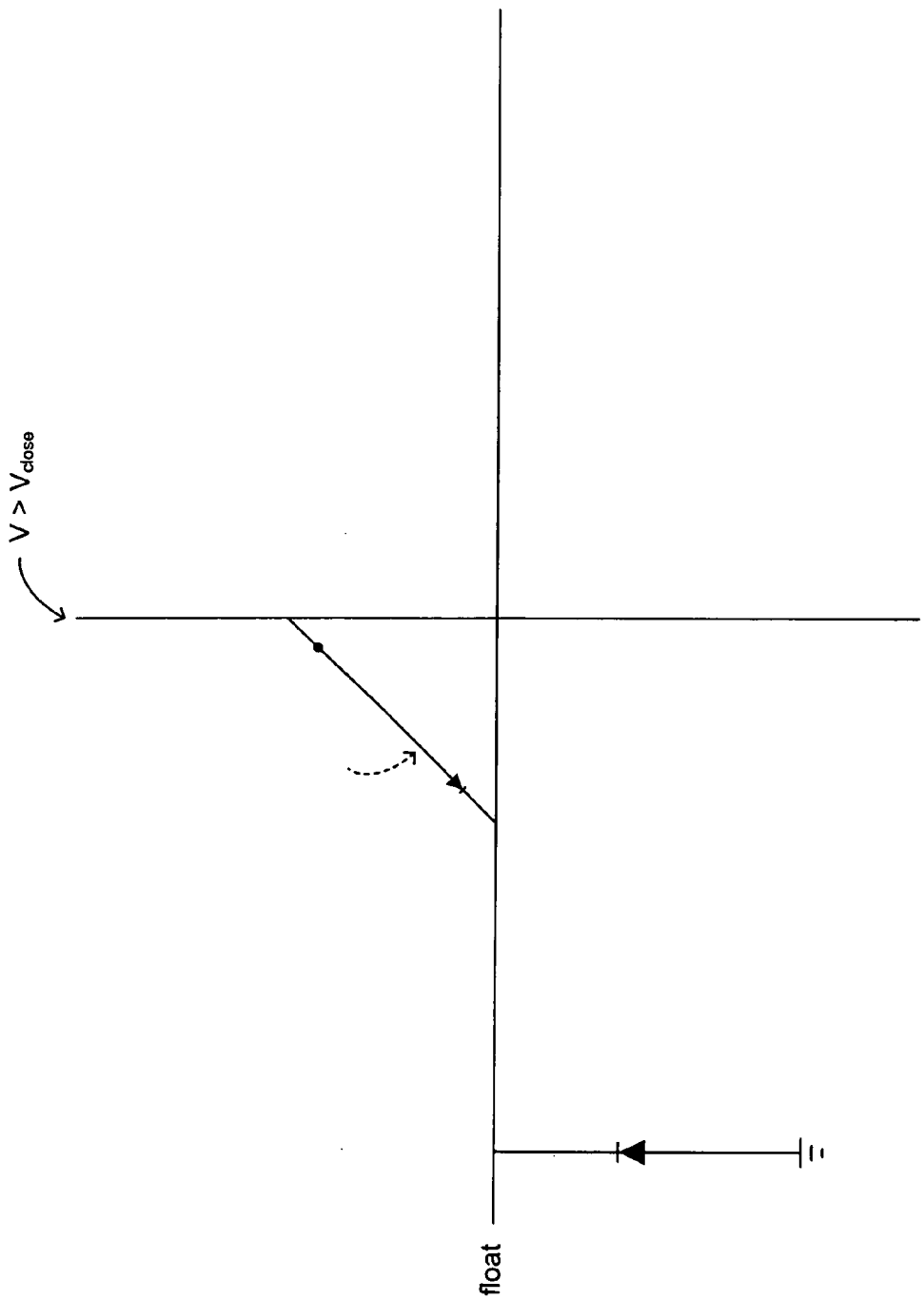
Figure 7B:
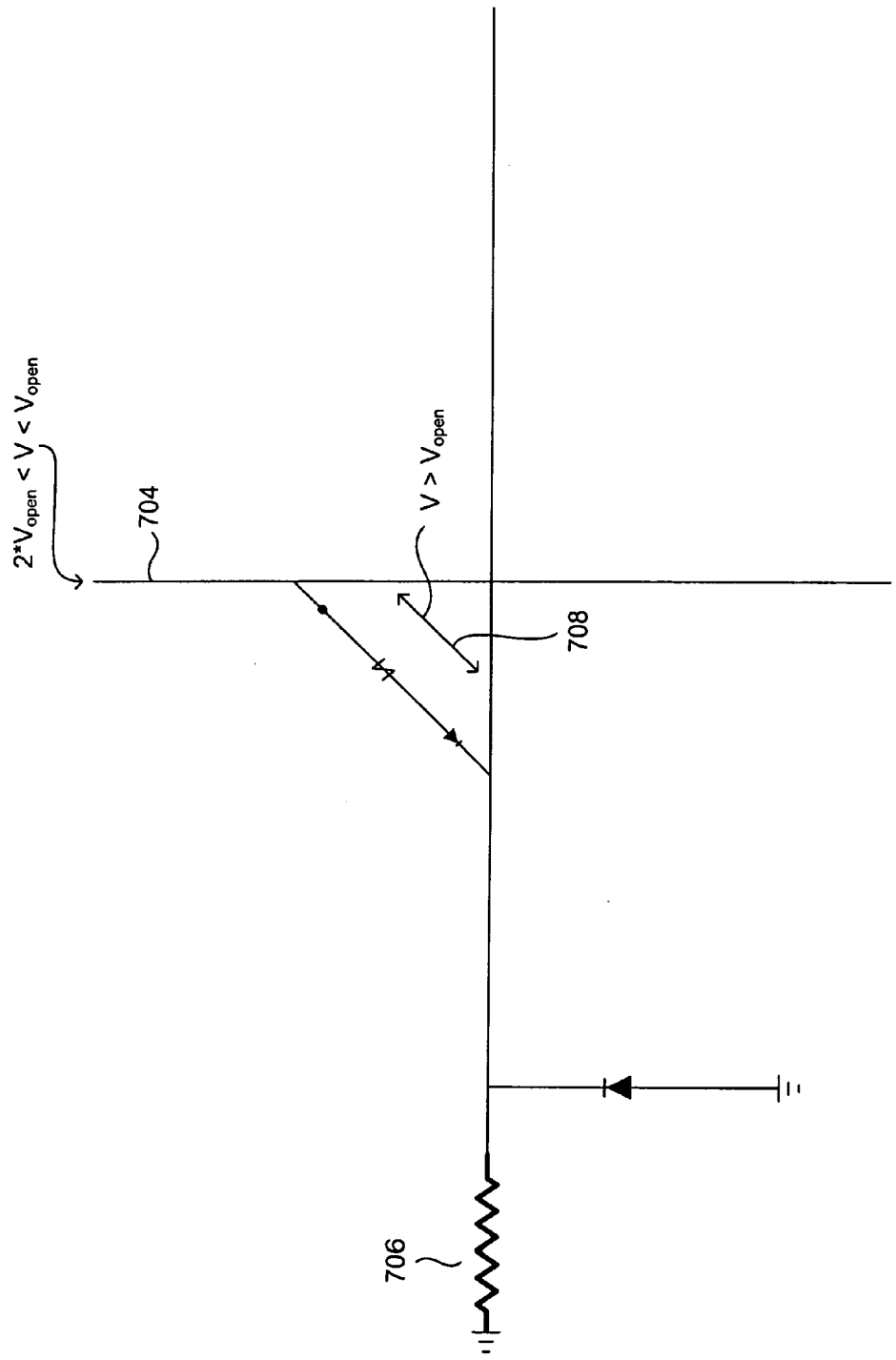

A second embodiment of a nanoscale latch uses different operational voltages and operates as a non-inverting latch. FIGS. 7A–C illustrate operation of a non-inverting nanoscale latch employed in various embodiments of the present invention. In order to prepare the non-inverting latch to receive data, the non-inverting latch is closed, by applying a voltage greater than $V_{close}$. When a low voltage, representing logical value "0," is input to the data bus through a resistor 706, and a negative write voltage V greater than $2 \times V_{open}$ but less than $V_{open}$ is applied to the vertical control line 704, the voltage dropped across the hysteretic, resistive nanowire junction 708 is greater than $V_{open}$, due to the voltage divider formed by the resistor 706 and the hysteretic, resistive nanowire junction, and the nanoscale latch remains closed. Thus, the nanoscale latch faithfully stores the logical value "0" input to the nanoscale latch. By contrast, when the logical value "1" is input to the data bus, represented by a float state on a data bus, and the write voltage is applied to the vertical control line 704, then the voltage drop across the hysteretic, resistive nanowire junction is less than $V_{open}$ and the transition from the closed to the open state (234 in FIG. 2) occurs, so that the nanoscale latch ends up storing the logical value "1" input to the data bus.

Figure 8A:
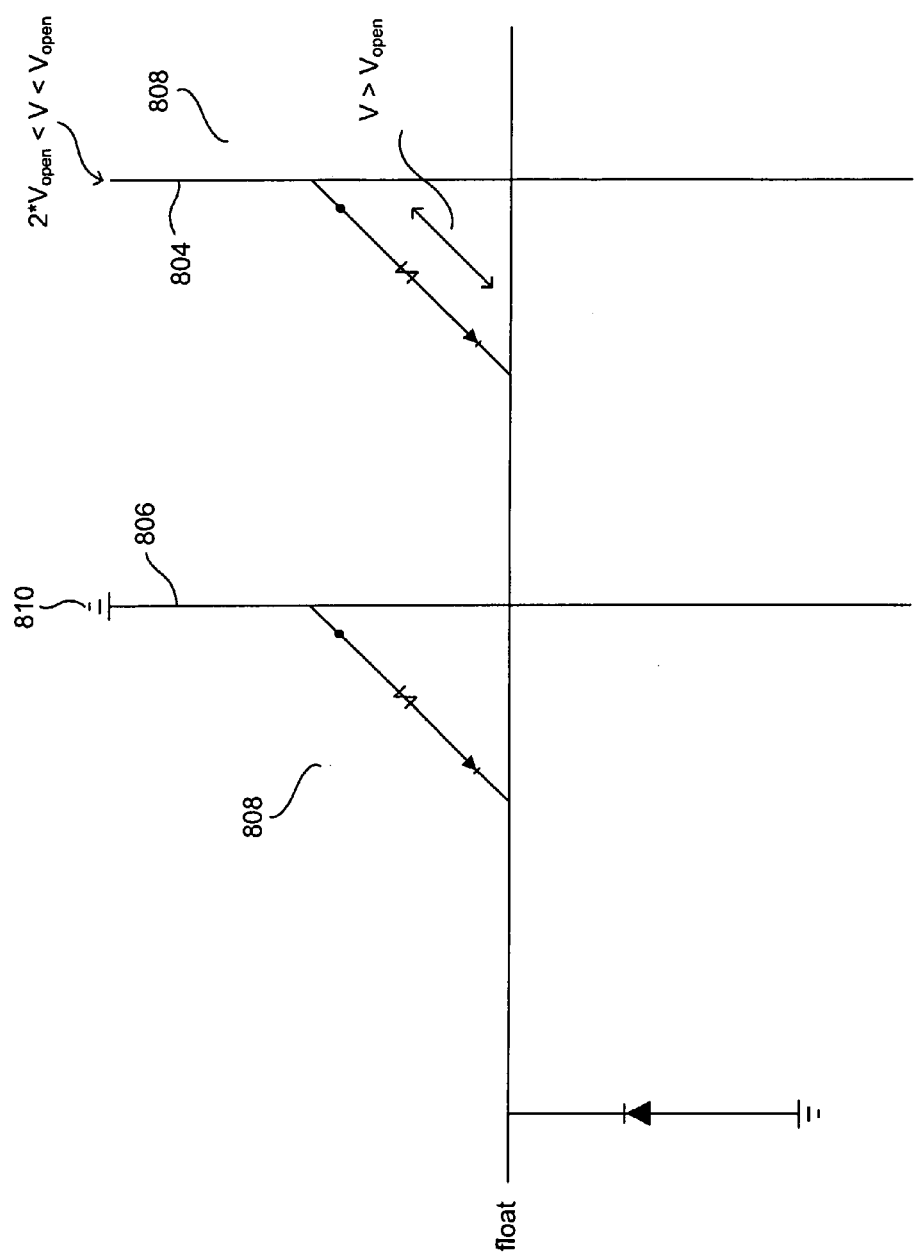
FIGS. 8A–B illustrate transfer of data from a source nanoscale latch to a target nanoscale latch along a nanowire data bus that interconnects non-inverting latches, employed in various embodiments of the present invention.
Figure 8B:
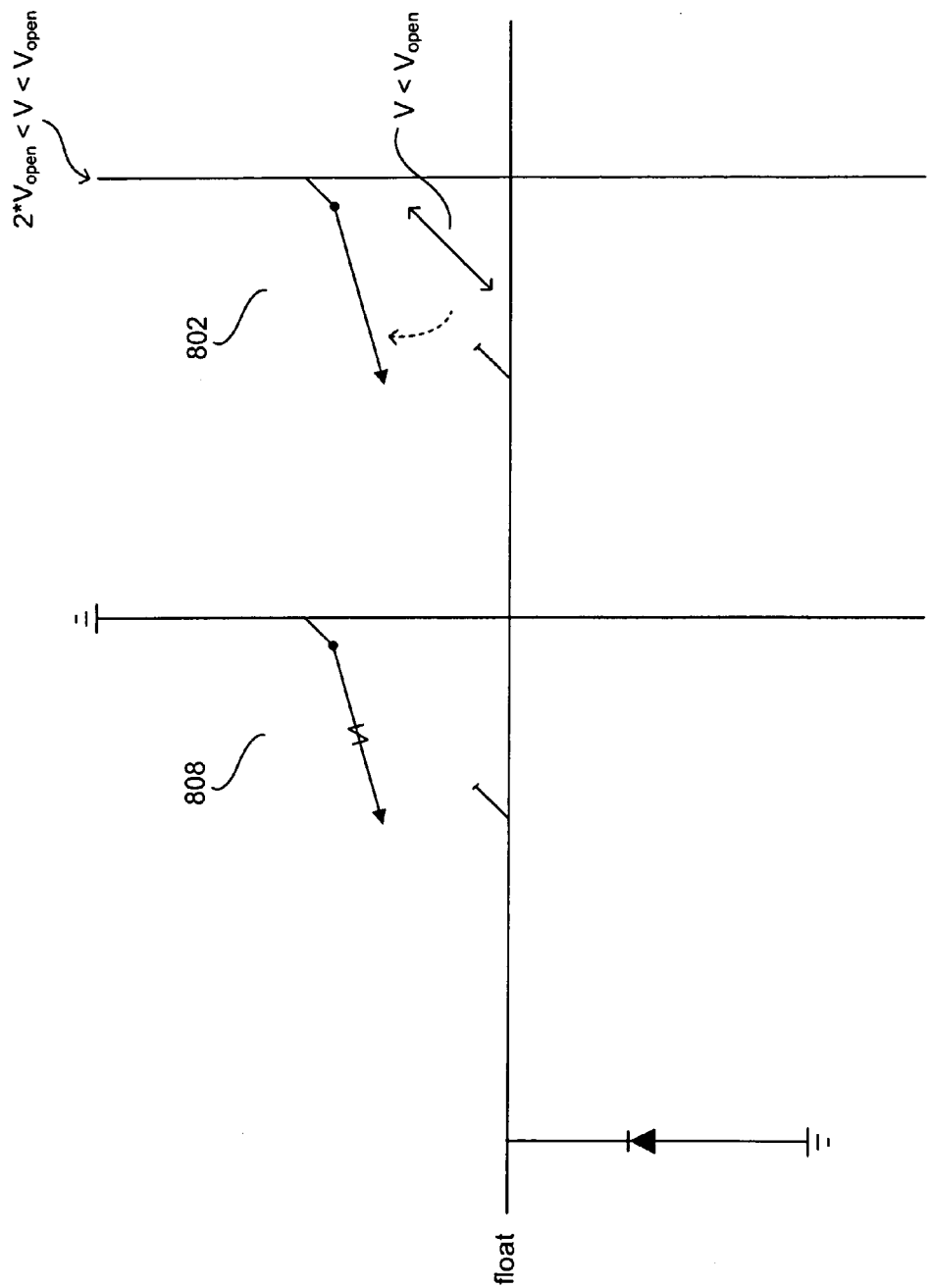

FIGS. 8A–B illustrate transfer of data from a source nanoscale latch to a target nanoscale latch along a nanowire data bus that interconnects non-inverting latches, employed in various embodiments of the present invention. The target nanoscale latch 802 is placed into a closed state, as discussed above with reference to FIG. 7A. Then, the negative write voltage V greater than $2 \times V_{open}$ and less than $V_{open}$ is applied to the vertical control line 804 of the target nanoscale latch, while the vertical control line 806 of the source nanoscale latch 808 is driven to ground 810. When, as shown in FIG. 8A, the source nanoscale latch is closed, a voltage greater than $V_{open}$ is obtained across the target nanoscale latch, due to the voltage divider formed by the source and target nanoscale latches, and the target nanoscale latch remains closed. By contrast, as shown in FIG. 8B, when the source nanoscale latch 808 is in the open state, then the entire negative write voltage ends up dropped across the target nanoscale latch 802, resulting in opening of the target nanoscale latch to reflect the state of the source nanoscale latch.

Thus, both inverting and non-inverting nanoscale latches can be assembled along a data bus, and logical values can be transferred from external sources to the data bus for storage into a target nanoscale latch, a logical value stored in a source nanoscale latch can be read out to an external target on the data bus, and a logical data value can be transferred from a source nanoscale latch to a target nanoscale latch along the data bus. These fundamental operations allow for implementation of arbitrary Boolean logic operators and operations on single-bit registers implemented as either inverting or non-inverting nanoscale latches along a nanowire data bus. Although either non-inverting or inverting latches can be used, the following discussion illustrates implementation of Boolean logic operations and operators for an array of inverting latches along a nanowire data bus. From this point on, the discussion assumes that a closed state represents logical value "1," and an open state represents logical value "0."

Figure 9A:
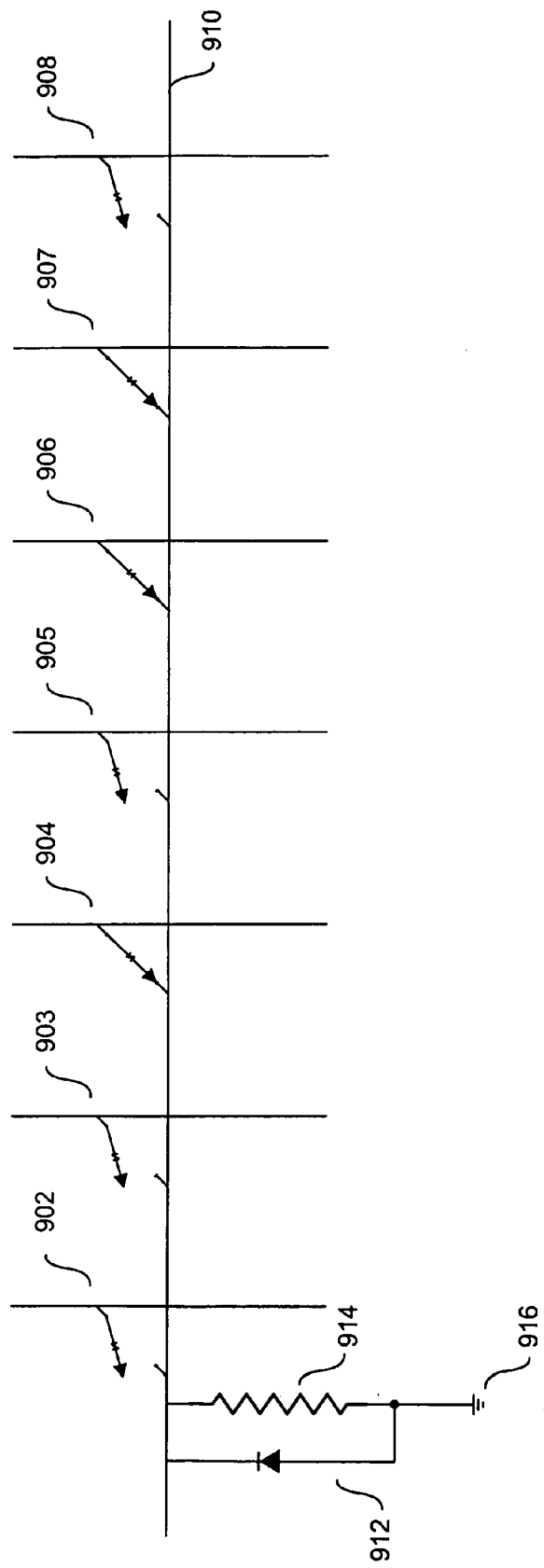
FIGS. 9A–B illustrate a seven-single-bit-nanoscale latch array used as a register array and representing one embodiment of the present invention.
Figure 9B:
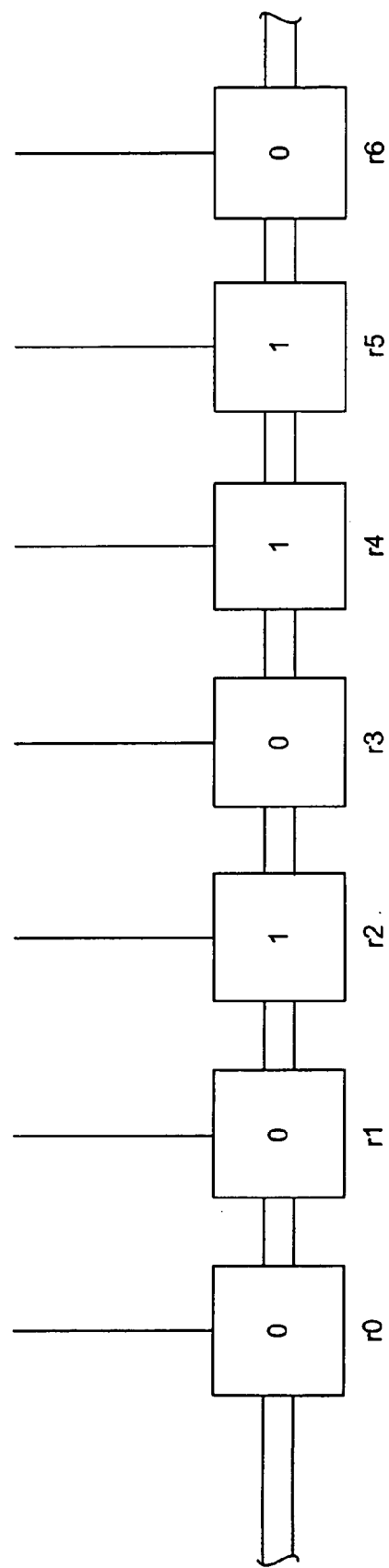

FIGS. 9A–B illustrate a seven-single-bit-nanoscale latch array used as a register array and representing one embodiment of the present invention. In FIG. 9, seven inverting nanoscale latches 902–908 are implemented along a single-bit nanowire data bus 910. A parallel diode 912 and resistor 914 interconnect the data bus 910 with ground 916, as needed for inverting nanoscale latches. Each inverting nanoscale latch 902–908 can be separately controlled by applying various input-signal voltages to the vertical control line of the inverting nanoscale latch. In general, the data bus 910 is allowed to float, except when data bits from external sources are input via the data bus to a target nanoscale latch or single-bit register. FIG. 9B shows a more schematic illustration of the seven-single-bit nanoscale-latch array shown in FIG. 9A. As shown in FIG. 9B, each latch is considered to be a single-bit register, and the nanoscale latches can be referred to, using well-known assembler-language convention, as r0, r1, etc. Each single-bit register can store a single logical value "0" or logical value "1," depending on the last state transition experienced by the single-bit register.

Figure 10A:
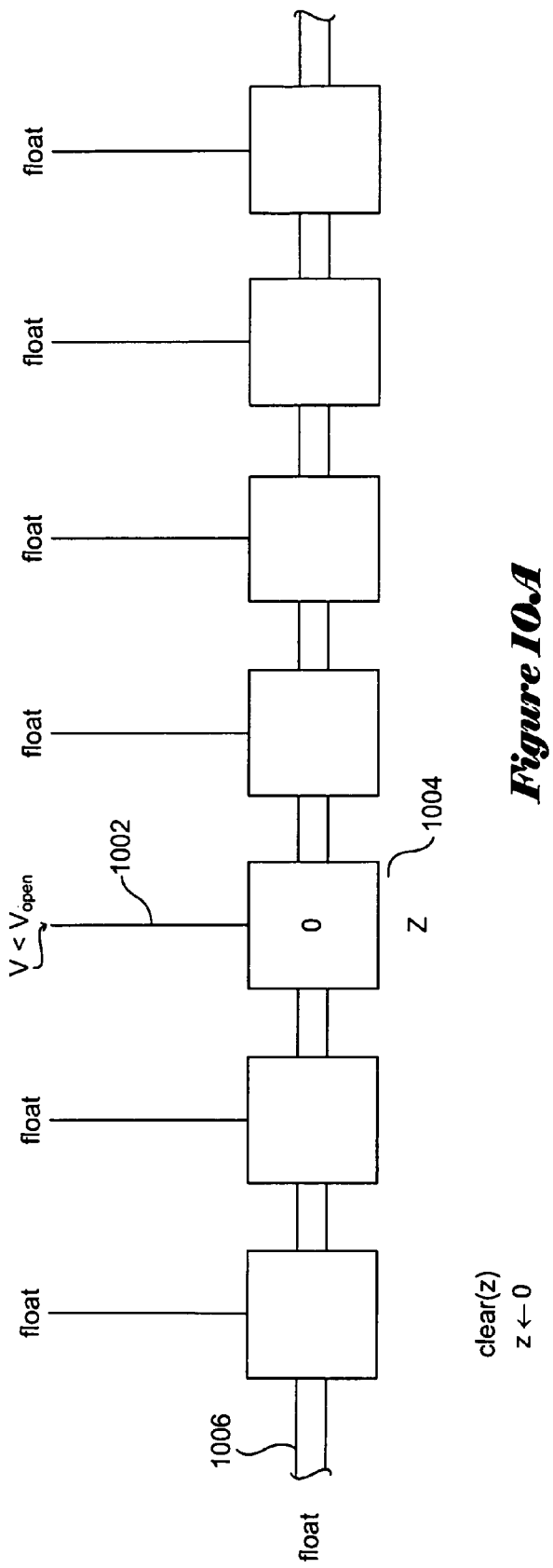

FIGS. 10A–F illustrate five primitive operations and a Boolean operation, implemented as a sequence of primitive operations, for a single-bit nanoscale register array, such as the single-bit nanoscale register array shown in FIG. 9B, that represents one embodiment of the present invention. FIG. 10A shows the primitive clear(z). The primitive clear(z) stores the logical value "0" in the z register. The symbol "z" stands for any of the registers r0, r1, r2, etc. In order to store the logical value "0" in the z register, a negative voltage less than $V_{open}$ is applied to the control line 1002 of the z register 1004, while the data bus 1006 is allowed to float.

Figure 10B:
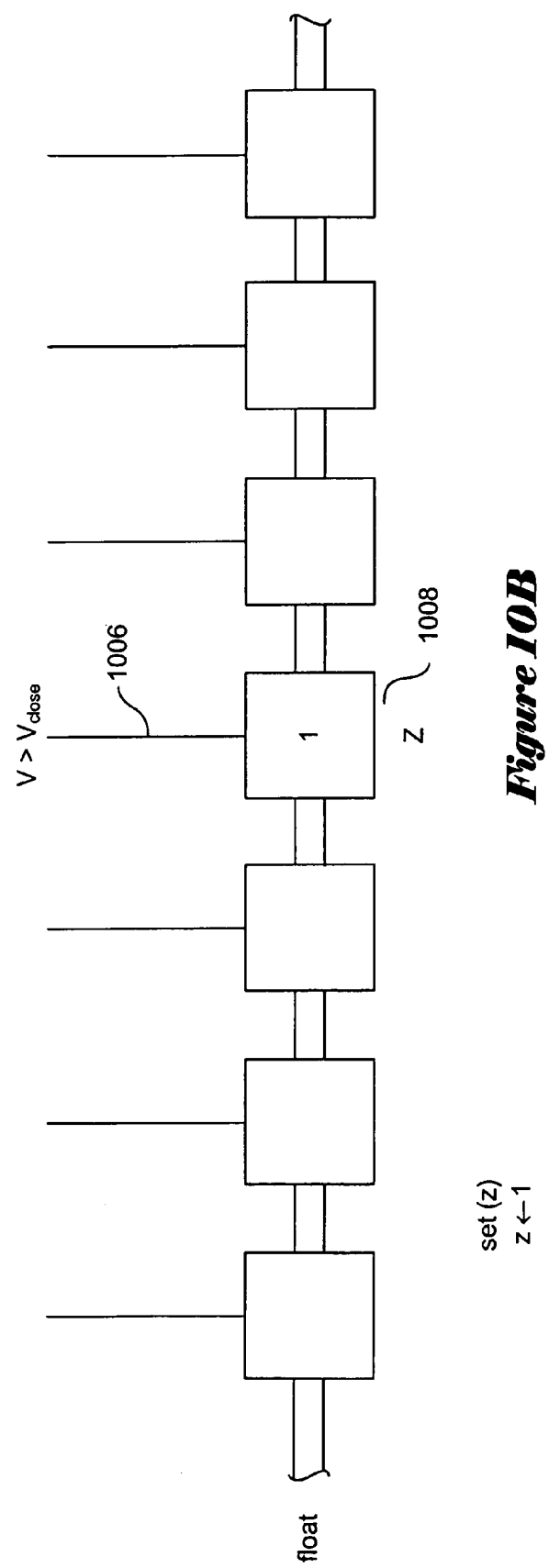

FIG. 10B illustrates the primitive set(z). The primitive set(z) places the logical value "1" into the z register. The primitive set(z) is implemented by applying a voltage greater than $V_{close}$ to the vertical control line 1006 of the z register 1008. FIG. 10C illustrates implementation of the conditionalSet(w,y) primitive.

The conditionalSet(w,y) primitive sets the value of register y to 1 when register w is currently storing the logical value "0." In other words, as shown in FIG. 10C, the primitive conditionalSet(w,y) is equivalent to the logical operation:

y←yOR¬w

The conditionalSet(w,y) primitive is implemented by applying a voltage greater than $V_{close}$ to the control line 1006 of the register y 1008 while a read voltage $V_{read}$ is applied to the control line 1010 of the register w 1012.

Figure 10D:
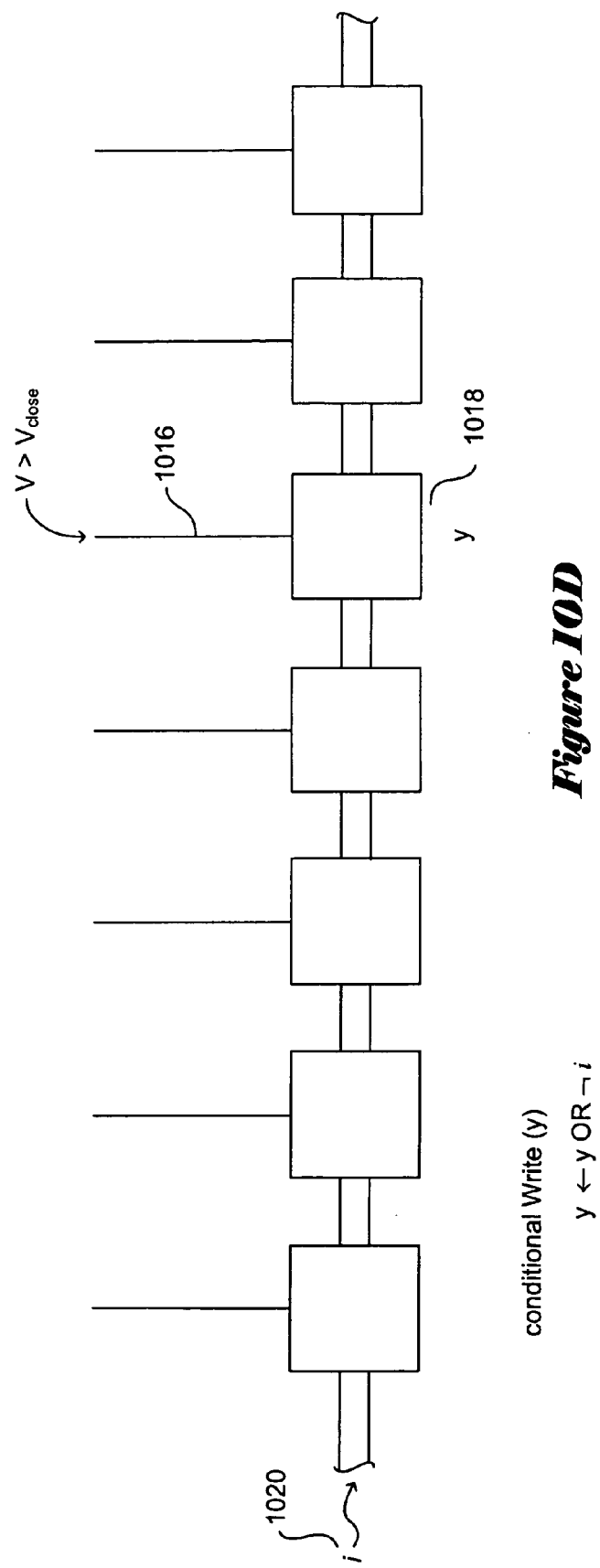

FIG. 10D illustrates implementation of the conditionalWrite(y) primitive. The conditionalWrite(y) primitive sets register y to the logical value "1" when a logical value "0" is input from an external source to the data bus. In other words, the conditionalWrite(y) primitive implements the Boolean expression:

y←yOR¬input

The conditionalWrite(y) primitive is implemented by applying a voltage greater than $V_{close}$ to the vertical control line 1016 of the register y 1018 and inputting a logical value, encoded in an applied voltage, 1020 to the data bus.

FIG. 10E illustrates the primitive read(x). The primitive read(x) outputs the logical value stored in register x to the data bus. The primitive read(x) is implemented by applying a voltage $V_{read}$ to the vertical wire 1016 of the register x 1018, resulting in either a voltage $V_{read}/2$ output to the data bus, in the case that register x stores the logical value "0," or results in the data bus being in a float state, when register x stores the logical value "1."

Figure 10F:
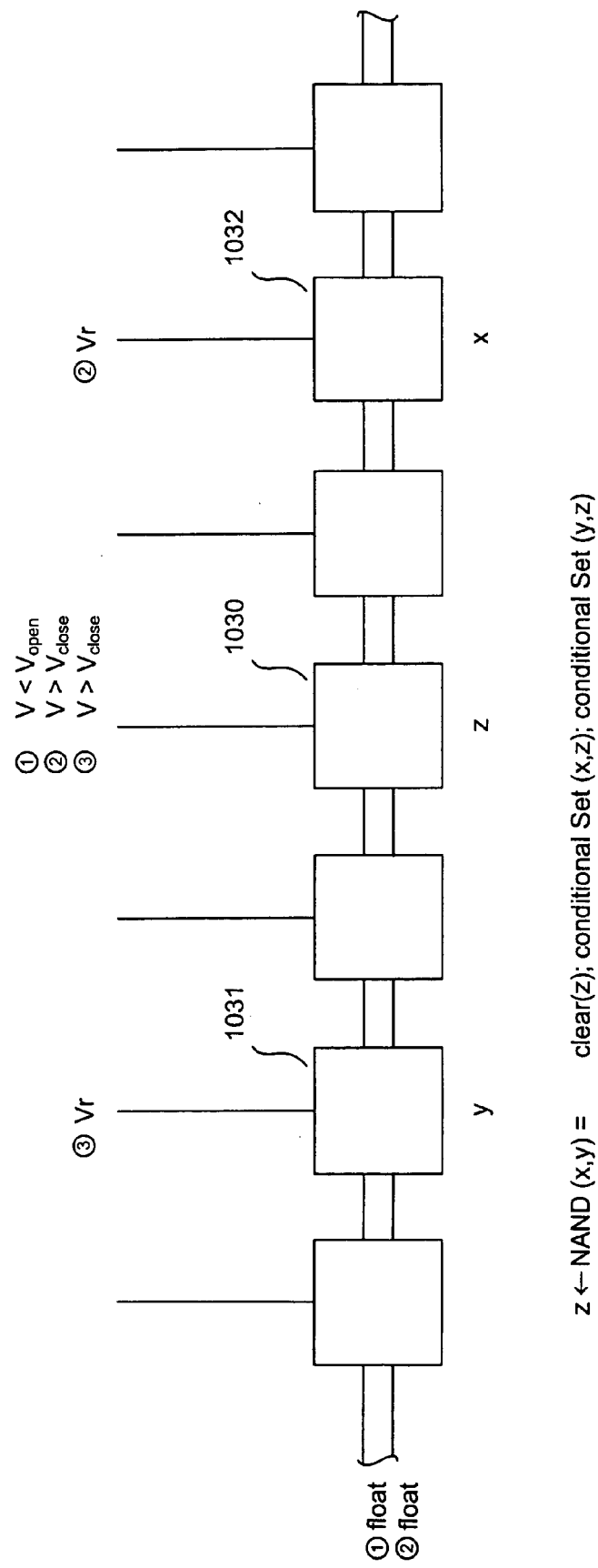

FIG. 10F illustrates implementation of the Boolean operation z← NAND (x,y) in the single-bit register array, such as the single-bit register array shown in FIG. 9B. The Boolean operation z←NAND (x,y) stores the logical value "1" in register z when neither register x nor register y stores the logical value "1." In other words, the Boolean operation z←NAND (x,y) is equivalent to the Boolean expression:

z←¬AND(x,y)

The Boolean operation z←NAND (x,y) implemented as a sequence of the three primitive operations clear(z), conditionalSet (x,z), and conditionalSet (y,z). In FIG. 10F, the operations corresponding to the three steps of the sequence are shown with circled-number prefixes to indicate the step at which the operation is carried out. To implement z←NAND (x,y), as shown in FIG. 10F, register z 1030 is first cleared. Register z is then conditionally set by register x 1032, and register z is finally conditionally set by register y 1034. If both registers x and y store the Boolean value "1," then the conditionalSet operations have no effect on register z, and register z ends up containing the logical value "0." If either or both of registers y and x store the logical value "0," then register z is set by one or both of the conditionalSet primitives.

Using the primitives discussed above with reference to FIGS. 10A–E, any arbitrary Boolean logic function can be implemented as a sequence of primitives. The Boolean operations and operands NAND, AND, NOT, OR, XOR, NOR, and various transfer, input, and output operations can be implemented as sequences of primitive operations, as follows:

z=NAND(x,y): clear(z); conditionalSet (x,z); conditionalSet (y,z)

z=AND (x,y): clear($s_1$); conditionalSet (x,$s_1$); conditionalSet (y,$s_1$);
  clear(z); conditionalSet ($s_1$,z)

z=NOT (x): clear(z); conditionalSet (x,z) // z !=x z=NOT (x): clear($s_1$); conditionalSet (x,$s_1$); clear($s_2$)
  conditionalSet ($s_1$,$s_2$); clear(z);
  conditionalSet ($s_2$,z)

z=OR(x,y): clear($s_1$); clear($s_2$); conditionalSet (x,$s_1$);
  conditionalSet (y,$s_2$); clear(z); conditionalSet (z,$s_1$);
  conditionalSet (z,$s_2$)

z=(x): clear($s_1$); conditionalSet (x,$s_1$);
  clear(z); conditionalSet ($s_1$,z)

z=XOR (x,y): clear($s_1$); clear($s_2$); conditionalSet (x,$s_1$);
  conditionalSet (y,$s_2$); clear(z); conditionalSet (z,$s_1$);
  conditionalSet (z,$s_2$); clear($s_2$); conditionalSet (x,$s_2$);
  conditionalSet (y,$s_1$); clear($s_1$); conditionalSet (z,$s_1$);
  conditionalSet ($s_2$$s_1$); clear(z); conditionalSet ($s_1$,z)

z=NOR (x,y): clear($s_1$); clear($s_2$); conditionalSet (x,$s_1$);
  conditionalSet (y,$s_2$); clear(z); conditionalSet (z,$s_1$);
  conditionalSet (z,$s_2$); clear($s_1$); conditionalSet (z,$s_1$);
  clear($s_2$); conditionalSet ($s_1$,$s_2$); conditionalSet (z,$s_2$)

input (z): clear($s_1$); conditionalWrite($s_1$); clear(z);
  conditionalSet ($s_1$,z)

inputNOT (z): clear(z); conditionalWrite (z)

output (z): read(z)

z=NOR (x,y): clear($s_1$); clear($s_2$); conditionalSet (x,$s_1$);
  conditionalSet (y,$s_2$); clear($s_3$); conditionalSet ($s_3$,$s_1$);
  conditionalSet ($s_3$,$s_2$); clear(z); conditionalSet (z,$s_3$)

In the above implementations of various Boolean logic operations and operators, and various support functions, the symbols z, x, and y each stand for one of the registers r0, r1, r2, .... The symbols $s_1$, $s_2$, and $s_3$ stand for scratch registers, each also one of registers r0, r1, r2, ... It is convenient to allocate particular registers as scratch registers, to facilitate programming a single-bit register array. For example, in a program to be discussed below, registers r4 and r5 are used as scratch registers $s_1$ and $s_2$. In this program, only implementations of Boolean operations and operators requiring two or less scratch registers are used. In general, there may be a tradeoff between the number of scratch registers used and the number of primitives needed to implement a particular operator or operation. For example, the first implementation of the NOR operation, shown above, employs only two scratch registers, and is implemented as a sequence of 12 primitives. A second implementation of the operation NOR, shown above, uses three scratch registers and is implemented as a sequence of only nine primitives. This trade-off between the number of scratch registers used and the length of the sequence needed to implement an operation is a classic example of trade-offs between time and computing resources encountered in all fields of computing. Another trade-off has to do with the generality of the implementation. The first NOT implementation, provided above, implements the z=NOT (x) function in a sequence of two primitives, but assumes that register z does not equal register x. A second implementation, in which no assumption concerning register z and register x is made, involves a sequence of six primitives.

As is well known to those skilled in the art of logic programming, or to those familiar with theoretical computer science, a single-bit register array embodiment of the present invention, such as the single-bit register array shown in FIG. 10A, is as computationally powerful as a Turing machine, and is therefore as computationally powerful as any classical computer currently available. This is not to say that a given computation can be executed on a single-bit-register array at the same speed as on a massively parallel supercomputer, for example. However, any computation that can be performed on any computer can also be performed on a single-bit-register array embodiment of the present invention. One example program for a seven-single-bit register array that adds two digitally encoded numbers of arbitrary length is next provided:

// Bit Serial Adder clear(r6);

loop once for each bit of the operands, least significant to most significant

{
  input (r0) // r0←a
  input (r1) // r1←b
  r2=XOR (r0,r1)
  r3=XOR (r2,r6)
  output (r3)
  r2=AND (r0,r1)

r3=AND (r0,r6)
r2=OR (r2,r3)
r3=AND (r1,r6)
r6=OR (r2,r3)
}

The program "bit serial adder," provided above, uses register r6 to contain a carry bit c, and in each iteration of the loop demarcated in the above code by brackets "{" and "}," reads in the next bit a of a first digitally encoded number and the next bit b of the second digitally encoded number, adds together the two bits a and b, outputs the result of the addition, and updates r6 containing the carry bit c. The addition is accomplished by XOR operations, r2=XOR (r0,r1), representing r2=XOR (a,b), and r3=XOR (r2,r6), representing r3=XOR (r2,c). The result of the two XOR operations is stored in register r3, and its output from register r3 to an external target. The carry bit is then updated via a series of AND and OR operations, resulting in the new carry bit stored in register r6. This program is executed in a seven-single-bit register array, such as the register array shown in FIG. 10A, by controlling the inputs to the vertical control lines of the registers and the input voltage to the data bus according to the above described implementations of operations, operators, and I/O functions as sequences of primitives. FIG. 11 illustrates an implementation of the program "bit serial adder" for execution on a nanoscale-processing-engine embodiment of the present invention. The implementation shown in FIG. 11 employs less primitive operations, but reads in each bit of the digitally encoded numbers twice.

Figure 12:
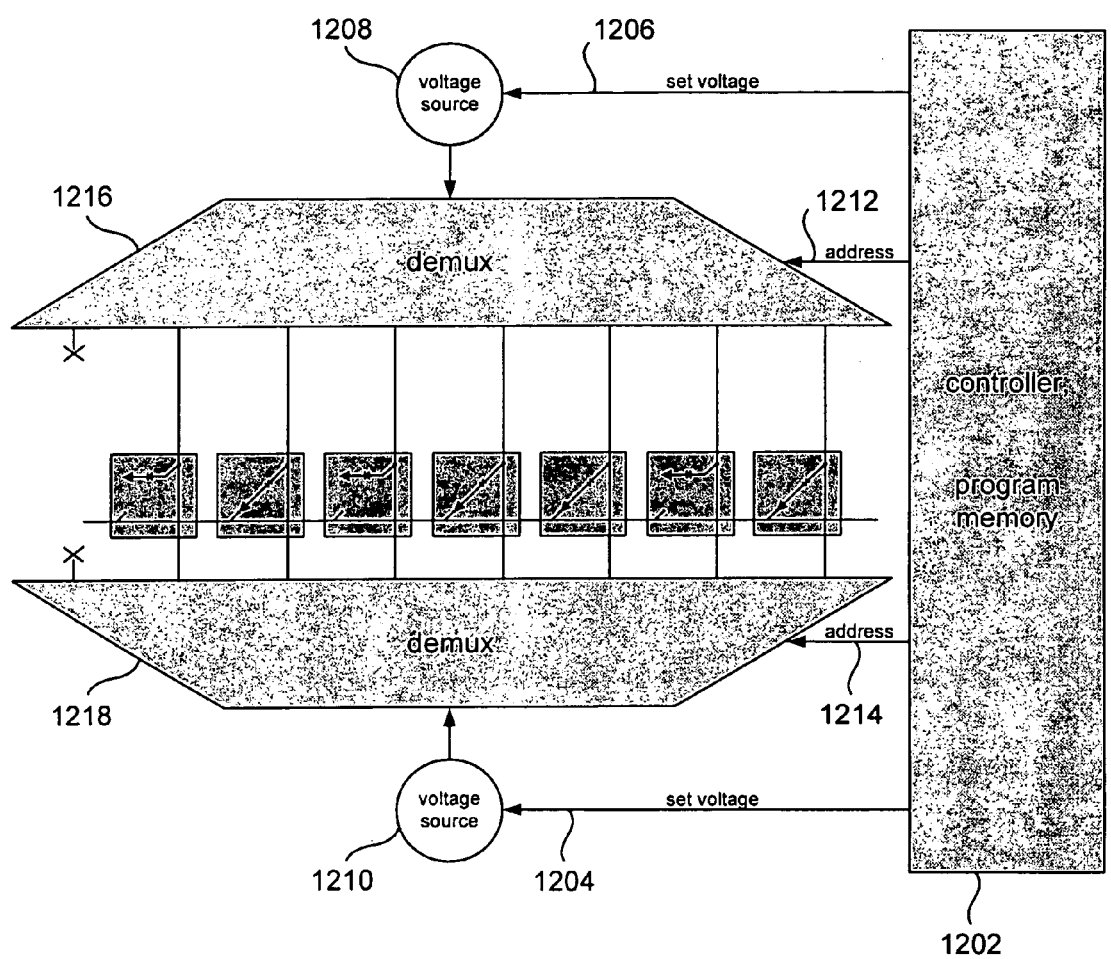
FIG. 12 illustrates a possible implementation of a stored-program computer using a single-bit nanoscale-register-array embodiment of the present invention.
Figure 13:
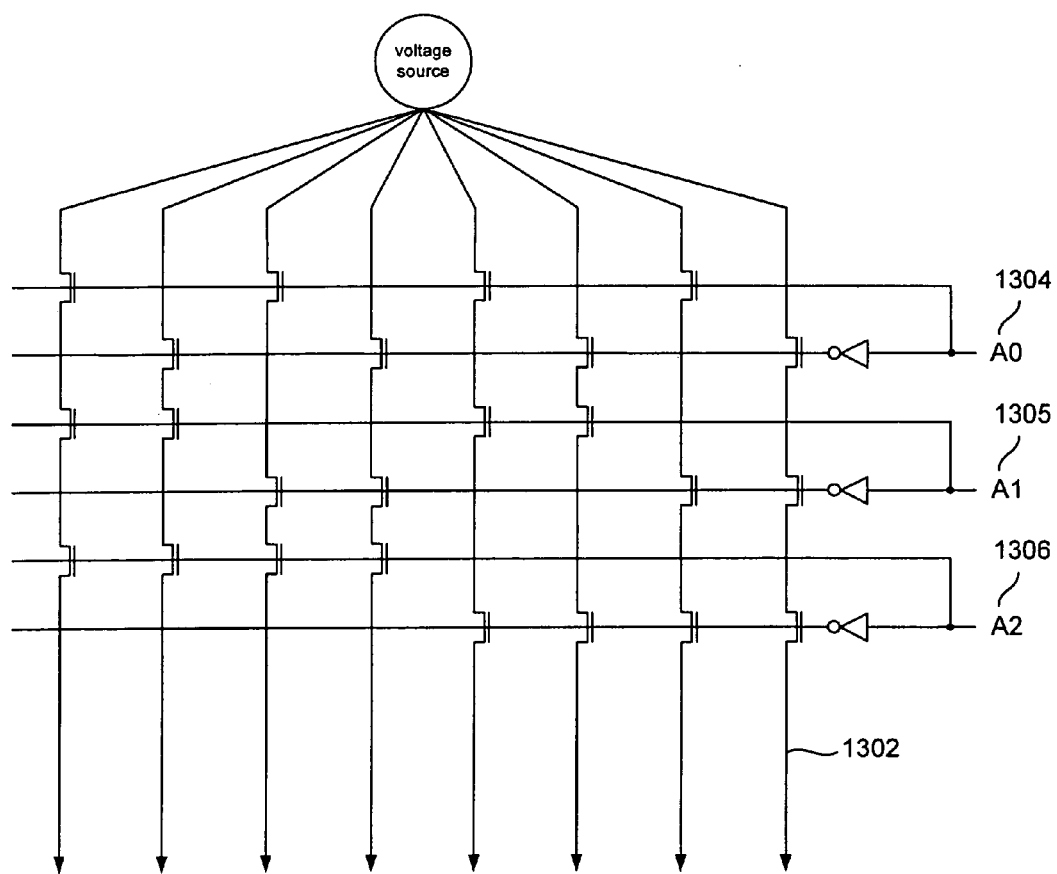
FIG. 13 is a schematic diagram of a field-effect-transistor-based nanoscale demultiplexer employed in various embodiments of the present invention.

A program, such as the above-described program "Bit Serial Adder," can be stored in an electronic memory, such as a nanowire-crossbar memory or other type of electronic memory, and can be executed by a controller that reads each program instruction from the memory and applies the voltage sequences corresponding to each instruction to the appropriate control lines and the data bus of a single-bit latch array. FIG. 12 illustrates a possible implementation of a stored-program computer using a single-bit nanoscale-register-array embodiment of the present invention. Vertical block 1202 represents the controller and stored program. The controller accesses each instruction of the stored program, in sequential order, and applies appropriate voltages to control lines and the data bus to execute each instruction. The controller applies voltages to control lines via control signals 1204 and 1206, to set the driving voltages applied by voltage sources 1208 and 1210, and via address signal lines 1212 and 1214 that direct demultiplexers 1216 and 1218 to output the driving voltages to individual control lines specified by addresses input by the controller to the address signal lines. Because all the primitive operations involve at most application of two different voltages to two different control lines, two demultiplexers are sufficient for implementation of all of the primitive operations discussed with reference to FIGS. 10A–D, and, therefore, implementation of any arbitrary Boolean logic operation or operator, as well as the support functions for input of data to, and output of data from, external sources. FIG. 13 is a schematic diagram of a field-effect-transistor-based nanoscale demultiplexer employed in various embodiments of the present invention. Each vertical output line, such as vertical output line 1302, can be input into a single-bit nanoscale latch as the control line. Each vertical nanowire, such as nanowire 1302, can be addressed uniquely by applying a three-bit address that specifies the vertical nanowire to address lines 1304–1306. Because there are three address lines, a total of eight vertical nanowires can be uniquely addressed. By increasing the number of address lines, single-bit register arrays of arbitrary lengths can be fabricated.

Single-bit register arrays can be used as processing components within nanoscale processors of arbitrary topology and complexity. For example, an array of 64 single-bit register arrays can be used to fabricate a 64-bit processor capable of executing 64-bit instructions. Single-bit register arrays can be organized in complex hierarchical, network-like, or graph-like topologies to form arbitrarily complex nanoscale processing engines with an almost limitless number of functions, parallel execution threads, and other processor characteristics. Embodiments of the present invention are, as discussed above, universal computing engines with the computing power of a Turing machine. A single-bit register array fabricated in the laboratory has been programmed to play the game "Tic Tac Toe." Embodiments of the present invention are thus fully functioning processors fabricated at molecular dimensions.

Although the present invention has been described in terms of a particular embodiment, it is not intended that the invention be limited to this embodiment. Modifications within the spirit of the invention will be apparent to those skilled in the art. For example, an almost limitless number of different types of single-bit register arrays can be fabricated, and the almost limitless number of different types of single-bit register arrays can be controlled by applying many different sequences of different types of voltages. In the above-described embodiment, only inverting latches are employed. However, it may be possible to employ both inverting and non-inverting latches together in larger collections and organizations of nanoscale latch arrays. In the above-described embodiment, primitives are implemented using only a small number of control voltages, but more elaborate and more efficient primitives may be implemented using a larger set of distinguishable, control voltages. Single-bit register arrays may be fashioned from a variety of different nanoscale electronic components, in addition to hysteretic, resistive nanowire junctions. Additional candidates include diode components, transistor components, and perhaps other nanowire junctions without simple analogs in commonly fabricated, submicroscale integrated circuits. By using different fixed input signals and scratch registers, primitives and Boolean operations can be implemented in a variety of different ways, often with trade-offs between time efficiency and resource efficiency. A further consideration in practical nanoscale electronics concerns the power consumption, or energy dissipation, involved in computation, and implementations of primitives can be developed to minimize power consumption.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A nanoscale computing engine comprising:
   a nanowire data bus;
   a plurality of nanoscale registers interconnected by the nanowire data bus, each nanoscale register driven by a nanoscale control line; and
   primitive operations, each primitive operation composed of one or more inputs to one or more of the nanowire data bus and nanoscale control lines, that provide for
      transfer of information from an external source to a specified nanoscale register,
      transfer of information from a nanoscale register source to an external target, and
      transfer of information from a first nanoscale register to a second nanoscale register.

2. The nanoscale computing engine of claim 1 wherein the nanowire data bus is generally held in a floating state, connected by a very high resistance connection to a voltage driver.

3. The nanoscale computing engine of claim 1 wherein the nanowire data bus may carry a positive voltage in order to transmit a logical value stored in a source nanoscale register to an external target.

4. The nanoscale computing engine of claim 3 wherein the nanowire data bus is connected to ground through a relative low resistance in order to drive one of two logical values into a target, non-inverting nanoscale register.

5. The nanoscale computing engine of claim 4 wherein the nanowire data bus is additionally interconnected to ground through a diode that is forward biased when a negative voltage is applied to the nanowire data bus.

6. The nanoscale computing engine of claim 3 wherein the nanowire data bus is driven with a positive voltage in order to drive one of two logical values into a target, inverting nanoscale register.

7. The nanoscale computing engine of claim 6 wherein the nanowire data bus is additionally interconnected to ground in parallel through a diode that is forward biased when a negative voltage is applied to the nanowire data bus and through a resistor.

8. The nanoscale computing engine of claim 1 wherein each nanoscale register stores one of two logical values "0" and "1" at a given time.

9. The nanoscale computing engine of claim 8 wherein a logical value can be stored in a target nanoscale register by placing the nanowire data bus into a state representing a corresponding logical value, and inputting an appropriate signal to the nanoscale control line that drives the target nanoscale register.

10. The nanoscale computing engine of claim 9 wherein a signal representing a logical value currently stored in a source nanoscale register can be output to the nanowire data bus by placing the nanowire data bus into a defined state and inputting an appropriate signal to the nanoscale control line that drives the target nanowire register.

11. The nanoscale computing engine of claim 10 wherein each nanoscale register comprises a hysteretic, resistive nanowire junction between the nanowire data bus and the nanoscale control line that drives the nanowire register, the hysteretic, resistive nanowire junction occupying one of two bi-stable resistivity states that represent the two logical values "0" and "1."

12. The nanoscale computing engine of claim 10 wherein the two bi-stable resistivity states include a low-resistivity closed state and a high-resistivity open state, a transition from the closed state to the open state carried out by applying a negative voltage equal to, or greater in magnitude than, the voltage $V_{open}$ across the hysteretic, resistive nanowire junction and a transition from the open state to the closed state carried out by applying a positive voltage equal to, or greater in magnitude than, the voltage $V_{close}$ across the hysteretic, resistive nanowire junction.

13. The nanoscale computing engine of claim 12 wherein a nanoscale register operates as an inverting register, storing a logical value opposite from the logical value input to the nanoscale register on the nanowire data bus.

14. The nanoscale computing engine of claim 13 wherein a logical value stored in nanoscale register is read onto the nanowire data bus by placing the nanowire data bus in a floating state and inputting a positive voltage less than $V_{open}$ across the hysteretic, resistive nanowire junction, wherein a first logical value is stored in the nanoscale register by placing a positive voltage greater than $V_{close}$ across the hysteretic, resistive nanowire junction while grounding the nanowire data bus, and wherein a second logical value is stored in the nanoscale register by placing a positive voltage greater than $V_{close}$ across the hysteretic, resistive nanowire junction while raising the nanowire data bus to a positive voltage less than $V_{close}$.

15. The nanoscale computing engine of claim 13 wherein a logical value stored in a first, source nanoscale register is stored in a second, target nanoscale register by placing the nanowire data bus in a floating state, placing a positive voltage $V_{read}$ across the source nanoscale register, and placing a positive voltage $V_{write}$ across the target nanoscale register.

16. The nanoscale computing engine of claim 12 wherein a nanoscale register operates as a non-inverting register, storing a logical value equal to the logical value input to the nanoscale register on the nanowire data bus.

17. The nanoscale computing engine of claim 16 wherein a logical value stored in nanoscale register is read onto the nanowire data bus by placing the nanowire data bus in a floating state and inputting a positive voltage less than $V_{open}$ across the hysteretic, resistive nanowire junction, wherein a first logical value is stored in the nanoscale register by placing a negative voltage greater than $2 \times V_{open}$ but less than $V_{open}$ across the hysteretic, resistive nanowire junction while grounding the nanowire data bus through a resistor, and wherein a second logical value is stored in the nanoscale register by placing a negative voltage greater than $2 \times V_{open}$ but less than $V_{open}$ across the hysteretic, resistive nanowire junction while placing the nanowire data bus is a floating state.

18. The nanoscale computing engine of claim 17 wherein a logical value stored in a first, source nanoscale register is stored in a second, target nanoscale register by placing the nanowire data bus in a floating state, connecting the source nanoscale register to ground through the control line of the source register, and placing a positive voltage $V_{write}$ across the target nanoscale register.

19. The nanoscale computing engine of claim 1 wherein the primitive operations include a clear(z) primitive that sets the contents of a target nanoscale register z to logical value "0."

20. The nanoscale computing engine of claim 1 wherein the primitive operations include a set(z) primitive that sets the contents of a target nanoscale register z to logical value "1."

21. The nanoscale computing engine of claim 1 wherein the primitive operations include a conditionalSet(w,y) primitive that sets the contents of a target nanoscale register y to logical value "1" when the nanoscale register w contains the logical value "0."

22. The nanoscale computing engine of claim 1 wherein the primitive operations include a conditionaWrite(y) primitive that sets the contents of a target nanoscale register y to logical value related to the logical value represented by the state of the nanowire data bus.

23. The nanoscale computing engine of claim 1 wherein the primitive operations include a read(x) primitive that places a signal representing the current contents of a target nanoscale register x onto the nanowire data bus.

24. The nanoscale computing engine of claim 1 wherein arbitrary Boolean operations and operators and I/O functions are implemented as sequences of primitive operations, the Boolean operations and operators and I/O functions including:
- z=NAND(x, y);
- z=NOT(x);
- z=NOR(x, y);
- z=AND(x, y);
- z=XOR(x, y);
- z=OR(x, y);
- z=input( );
- z=output( ); and wherein z, x, and y are symbolic representations of particular nanoscale registers.

25. The nanoscale computing engine of claim 1 further including:
- a stored program of instructions; and
- a controller that executes the stored program by applying control signals to the nanoscale computing engine to execute the instructions as sequences of primitive operations.

26. The nanoscale computing engine of claim 25 further including:
- two controllable voltage sources; and
- two demultiplexers, the demultiplexers outputting voltage signals from the two voltage sources to operand nanoscale registers in response to input from the controller.

27. The nanoscale computing engine of claim 1 combined together with additional nanoscale computing engines to form nanoscale processors of arbitrary complexity and functionality.

28. A method for performing a computation, the method comprising:
- providing nanoscale computing engine that includes a nanowire data bus and a plurality of nanoscale registers interconnected by the nanowire data bus, each nanoscale register driven by a nanoscale control line;
- defining primitive operations, each primitive operation composed of one or more inputs to one or more of the nanowire data bus and nanoscale control lines, that provide for
  - transfer of information from an external source to a specified nanoscale register,
  - transfer of information from a nanoscale register source to an external target, and
  - transfer of information from a first nanoscale register to a second nanoscale register;
- composing a program, consisting of one or more of the defined primitive operations, that, when executed, performs the computation; and
- controlling inputs to one or more of the nanowire data bus and nanoscale control lines to execute the program.

29. A method for constructing a nanoscale computing device, the method comprising:
- providing a nanowire data bus;
- fabricating a plurality of nanoscale registers along the nanowire data bus and interconnected by the nanowire data bus;
- fabricating a nanoscale control line for each nanoscale register to drive the nanoscale register; and
- defining primitive operations for the nanoscale computing device, each primitive operation composed of one or more inputs to one or more of the nanowire data bus and nanoscale control lines that provide for
  - transfer of information from an external source to a specified nanoscale register,
  - transfer of information from a nanoscale register source to an external target, and
  - transfer of information from a first nanoscale register to a second nanoscale register.

* * * * *

UNITED STATES PATENT AND TRADEMARK OFFICE
CERTIFICATE OF CORRECTION

PATENT NO.        : 7,227,379 B1
APPLICATION NO.   : 11/192197
DATED             : June 5, 2007
INVENTOR(S)       : Gregory S. Snider et al.

It is certified that error appears in the above-identified patent and that said Letters Patent is hereby corrected as shown below:

On the Title page, in field (73), in "Assignee", in column 1, line 1, delete "Develoment" and insert -- Development --, therefor.

In column 15, line 2, in Claim 22, delete "conditionaWrite(y)" and insert -- conditionalWrite(y) --, therefor.

Signed and Sealed this

Sixth Day of October, 2009

David J. Kappos
*Director of the United States Patent and Trademark Office*